US012604632B2

(12) United States Patent
Lee et al.

(10) Patent No.: US 12,604,632 B2
(45) Date of Patent: Apr. 14, 2026

(54) DISPLAY APPARATUS

(71) Applicant: Samsung Display Co., Ltd., Yongin-si (KR)

(72) Inventors: Sangshin Lee, Yongin-si (KR); Sanghoon Kim, Yongin-si (KR); Jongsung Park, Yongin-si (KR); Seungjin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 524 days.

(21) Appl. No.: 18/315,341

(22) Filed: May 10, 2023

(65) Prior Publication Data

US 2023/0371338 A1     Nov. 16, 2023

(30) Foreign Application Priority Data

May 13, 2022    (KR) ........................ 10-2022-0059103

(51) Int. Cl.
  *H10K 59/35*      (2023.01)
  *G09G 3/3233*      (2016.01)
  *H10K 59/122*      (2023.01)
(52) U.S. Cl.
  CPC ......... *H10K 59/353* (2023.02); *G09G 3/3233* (2013.01); *H10K 59/122* (2023.02); *G09G 2300/0452* (2013.01); *G09G 2300/0842* (2013.01)

(58) Field of Classification Search
  CPC .. H10K 59/353; H10K 59/122; H10K 59/352; H10K 59/351; H10K 59/1213; H10K 59/123; H10K 50/805; G09G 3/3233; G09G 2300/0452; G09G 2300/0842; G09G 2300/0426
  See application file for complete search history.

(56) References Cited

U.S. PATENT DOCUMENTS

| | | | |
|---|---|---|---|
| 10,909,901 B2 | 2/2021 | Wu et al. | |
| 11,004,905 B2 | 5/2021 | Sun et al. | |
| 2020/0212125 A1* | 7/2020 | Liu ..................... | H10K 59/351 |
| 2022/0109033 A1 | 4/2022 | Huangfu et al. | |

FOREIGN PATENT DOCUMENTS

| | | |
|---|---|---|
| CN | 112436029 A | 3/2021 |
| CN | 113097273 A | 7/2021 |
| KR | 10-2019-0117720 A | 10/2019 |

* cited by examiner

*Primary Examiner* — Donald L Raleigh
(74) *Attorney, Agent, or Firm* — Womble Bond Dickinson (US) LLP

(57)     ABSTRACT

A display apparatus includes: a substrate; and an array of pixels comprising first pixels, second pixels, and third pixels arranged on the substrate to respectively emit light of a first color, light of a second color, and light of a third color, wherein the array of pixels comprises: a first column comprising the first pixels; and a second column adjacent to the first column, and comprising the second pixels and the third pixels, wherein the second pixels and the third pixels are alternately arranged, wherein a virtual line connecting centroids of the first pixels of the first column has a zigzag shape, wherein a first shortest distance between two first pixels adjacent to each other in a first direction from among the first pixels is different from a second shortest distance between two other first pixels adjacent to each other in the first direction from among the first pixels.

20 Claims, 17 Drawing Sheets

FIRST SECOND THIRD FOURTH
COLUMN COLUMN COLUMN COLUMN

FIRST SECOND THIRD FOURTH
COLUMN COLUMN COLUMN COLUMN

Pr

Pg
220g
119OP1
220r
119OP2

119OP1

119OP3
220b

Pb

230

MOP1

M1

MOP2

M2

DISPLAY APPARATUS

CROSS-REFERENCE TO RELATED APPLICATION

The present application claims priority to and the benefit of Korean Patent Application No. 10-2022-0059103, filed on May 13, 2022, in the Korean Intellectual Property Office, the entire disclosure of which is incorporated herein by reference.

BACKGROUND

1. Field

Aspects of one or more embodiments relate to a display apparatus.

2. Description of the Related Art

Recently, display apparatuses have been widely used for various applications. Also, with the progression of technology, as thicknesses and weights of display apparatuses have decreased, the range of applications or uses of display apparatuses has increased.

As display apparatuses are being used in various ways, and in a variety of applications and use cases, there is an increasing demand for display apparatuses capable of displaying relatively high quality images.

The above information disclosed in this Background section is only for enhancement of understanding of the background and therefore the information discussed in this Background section does not necessarily constitute prior art.

SUMMARY

Aspects of one or more embodiments include a display apparatus that may be capable of improving the quality, for example, visibility, of images displayed by the display apparatus. However, the characteristics of some embodiments described below are examples, and do not limit the scope of embodiments according to the present disclosure.

Additional aspects will be set forth in part in the description which follows and, in part, will be apparent from the description, or may be learned by practice of the presented embodiments.

According to one or more embodiments, a display apparatus includes a substrate, and an array of pixels including first pixels, second pixels, and third pixels that are two-dimensionally arranged on the substrate to respectively emit light of a first color, light of a second color, and light of a third color, wherein the array of pixels includes a first column including the first pixels, and a second column located adjacent to the first column, and including the second pixels and the third pixels, wherein the second pixels and the third pixels are alternately arranged, wherein a virtual line connecting centroids of the first pixels of the first column has a zigzag shape, wherein a first shortest distance between two first pixels adjacent to each other in a first direction from among the first pixels is different from a second shortest distance between two other first pixels adjacent to each other in the first direction from among the first pixels.

According to some embodiments, centroids of the second pixels and centroids of the third pixels of the second column may be located on a virtual straight line extending in a second direction that intersects the first direction.

According to some embodiments, both sides of each of the second pixels and the third pixels of the second column may be symmetric to each other with respect to the virtual straight line.

According to some embodiments, any one third pixel of the third pixels of the second column may be located between two second pixels from among the second pixels of the second column, wherein an edge of the any one third pixel faces an edge of any one second pixel from among the two second pixels, and a corner portion of the any one third pixel faces a corner portion of another second pixel from among the two second pixels.

According to some embodiments, two adjacent first pixels from among the first pixels may be symmetric to each other with respect to a reference point on a virtual straight line that connects centroids of the two adjacent first pixels.

According to some embodiments, the array of pixels may further include a third column located adjacent to the second column, and including first pixels.

According to some embodiments, centroids of the first pixels of the first column and centroids of the first pixels of the third column may be located on a virtual line having a zigzag shape in the first direction.

According to some embodiments, centroids of the first pixels of the first column and centroids of the first pixels of the third column may be located on a virtual straight line extending in the first direction.

According to some embodiments, the array of pixels may further include a fourth column located adjacent to the third column, and including second pixels and third pixels, wherein the second pixels and the third pixels of the fourth column are alternately arranged, wherein the second pixels of the second column and the third pixels of the fourth column are arranged in a same row in the first direction, and centroids of the second pixels and centroids of the third pixels arranged in the same row are located on a virtual line having a zigzag shape in the first direction.

According to some embodiments, at least one of the first pixels, the second pixels and the third pixels may include at least five internal angles.

According to some embodiments, a third shortest distance between two adjacent first pixels from among the first pixels of the first column may be different from a fourth shortest distance between two other adjacent first pixels from among the first pixels of the first column.

According to some embodiments, a shortest distance between adjacent first pixels from among the first pixels of the first column may be same.

According to some embodiments, the first pixels may be green pixels, and either the second pixels or the third pixels may be red pixels and the others of the second pixels and the third pixels may be blue pixels.

According to one or more embodiments, a display apparatus includes a substrate, a plurality of pixel electrodes two-dimensionally arranged on the substrate, a bank layer located on the plurality of pixel electrodes, and including a plurality of openings respectively overlapping the plurality of pixel electrodes, first emission layers, second emission layers, and third emission layers located on the bank layer, and a counter electrode on the first through third emission layers, wherein the plurality of openings of the bank layer include a first column including first openings, and a second column located adjacent to the first column, and including second openings and third openings, wherein the second openings and the third openings are alternately arranged, wherein a virtual line connecting centroids of the first openings of the first column has a zigzag shape, wherein a first shortest distance between two first openings adjacent to each other in a first direction from among the first openings is different from a second shortest distance between two other first openings adjacent to each other in the first direction from among the first openings.

According to some embodiments, centroids of the second openings and centroids of the third openings of the second column may be located on a virtual straight line extending in a second direction that intersects the first direction.

According to some embodiments, the plurality of openings further may include a third column located adjacent to the second column, and including first openings.

According to some embodiments, centroids of the first openings of the first column and centroids of the first openings of the third column may be located on a virtual line having a zigzag shape in the first direction.

According to some embodiments, centroids of the first openings of the first column and centroids of the first openings of the third column may be located on a virtual straight line extending in the first direction.

According to some embodiments, the second emission layers may respectively overlap the second openings, the third emission layers may respectively overlap the third openings, and the first emission layers may be spaced apart from each other, wherein each of the first emission layers extends in the first direction and overlaps a plurality of first openings.

According to some embodiments, the first emission layers may be green emission layers that emit green light, the second emission layers may be red emission layers that emit red light, and the third emission layers may be blue emission layers that emit blue light.

BRIEF DESCRIPTION OF THE DRAWINGS

The above and other aspects, features, and characteristics of certain embodiments will be more apparent from the following description taken in conjunction with the accompanying drawings, in which.

DETAILED DESCRIPTION

Figure 1:
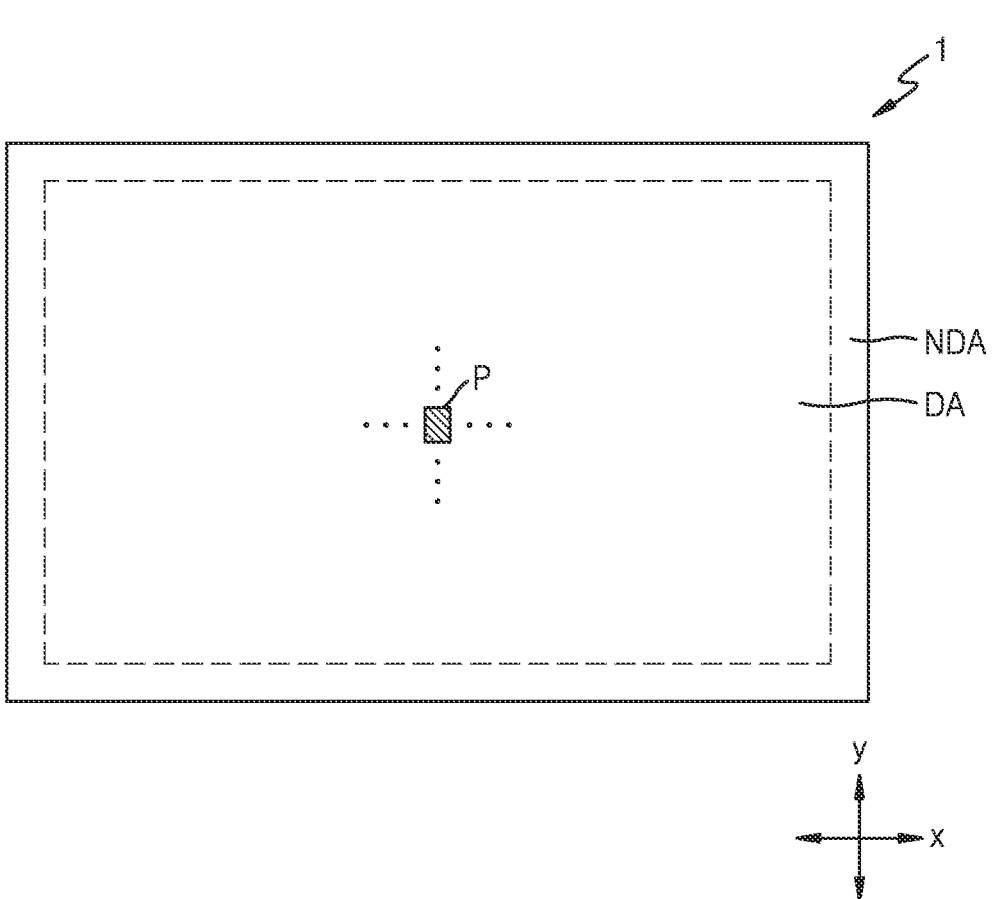
FIG. 1 is a plan view schematically illustrating a display apparatus, according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or any combination of a, b, and/or c. Throughout the disclosure, the expression "at least one of a, b and c" indicates only a, only b, only c, both a and b, both a and c, both b and c, all of a, b, and c, or any combination of a, b, and/or c.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, embodiments according to the present disclosure are not limited to the following embodiments and may be embodied in various forms.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be further understood that the terms "comprises" or "comprising" used herein specify the presence of stated features or components, but do not preclude the presence or addition of one or more other features or components.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of components in the drawings may be exaggerated or contracted for convenience of explanation. For example, because sizes and thicknesses of elements in the drawings are arbitrarily illustrated for convenience of explanation, embodiments according to the present disclosure are not limited thereto.

"A and/or B" is used herein to select only A, select only B, or select both A and B. Also, "at least one of A and B" is used herein to select only A, select only B, or select both A and B.

In the following embodiments, when a wiring "extends in a first direction or a second direction," it may mean that the wiring extends not only in a linear shape but also in a zigzag or curved shape in the first direction or the second direction.

In the following embodiments, "a plan view of an object" refers to "a view of an object seen from above, and "a cross-sectional view of an object" refers to "a view of an object vertically cut and seen from the side. In the following embodiments, when elements "overlap," it may mean that the elements overlap in a "plan view" and a "cross-sectional view".

Hereinafter, embodiments will be described in detail with reference to the accompanying drawings, wherein the same or corresponding elements are denoted by the same reference numerals throughout.

FIG. 1 is a plan view schematically illustrating a display apparatus, according to some embodiments.

Referring to FIG. 1, a display apparatus 1 may include a display area DA and a non-display area NDA outside the display area DA. The display apparatus 1 may display images through an array of pixels that are two-dimensionally arranged in the display area DA.

Each pixel of the display apparatus 1 is an area where light of a certain color may be emitted, and the display apparatus 1 may display images by using light emitted by the pixels. For example, each pixel may emit red light, green light, blue light, or white light.

Each pixel may emit light of a certain color by using a light-emitting diode, for example, an organic light-emitting diode. Each organic light-emitting diode may emit, for example, red light, green light, blue light, or white light. Each organic light-emitting diode may be connected to a pixel circuit including a thin-film transistor and a capacitor.

The non-display area NDA where images are not displayed may entirely surround the display area DA. That is, the non-display area NDA may be in a periphery of the display area DA (e.g., outside a footprint of the display area DA). A driver or a main power supply line for applying an electrical signal or power to pixel circuits may be located in the non-display area NDA. A pad to which an electronic device or a printed circuit board may be electrically connected may be included in the non-display area NDA.

The display area DA may have a polygonal shape including a quadrangular shape as shown in FIG. 1. For example, the display area DA may have a rectangular shape in which a horizontal length is greater than a vertical length, a rectangular shape in which a horizontal length is less than a vertical length, or a square shape. Alternatively, the display area DA may have any of various shapes such as an elliptical shape or a circular shape.

Examples of the display apparatus 1 may include a mobile phone, a television, an advertisement board, a tablet PC, a laptop, and a smart watch or a smart band worn on a wrist.

Figure 2:
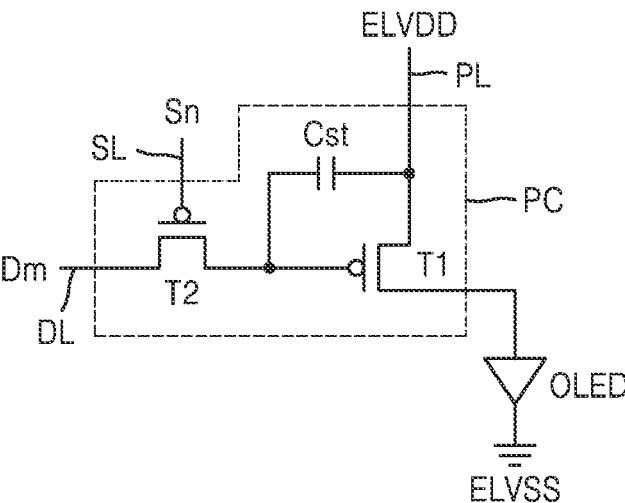
FIG. 2 is an equivalent circuit diagram illustrating a circuit connected to an organic light-emitting diode of a display apparatus, according to some embodiments.

FIG. 2 is an equivalent circuit diagram illustrating a circuit connected to an organic light-emitting diode of a display apparatus, according to some embodiments.

Referring to FIG. 2, an organic light-emitting diode OLED is electrically connected to a pixel circuit PC. The pixel circuit PC may include a first thin-film transistor T1, a second thin-film transistor T2, and a storage capacitor Cst.

The second thin-film transistor T2 that is a switching thin-film transistor may be connected to a scan line SL and a data line DL, and may transmit a data voltage (or a data signal Dm) input from the data line DL to the first thin-film transistor T1 based on a switching voltage (or a switching signal Sn) input from the scan line SL. The storage capacitor Cst may be connected to the second thin-film transistor T2 and a driving voltage line PL, and may store a voltage corresponding to a difference between a voltage received from the second thin-film transistor T2 and a first power supply voltage ELVDD supplied to the driving voltage line PL.

The first thin-film transistor T1 that is a driving thin-film transistor may be connected to the driving voltage line PL and the storage capacitor Cst, and may control driving current flowing from the driving voltage line PL to the organic light-emitting diode OLED according to a value of the voltage stored in the storage capacitor Cst. The organic light-emitting diode OLED may emit light having a certain luminance due to the driving current. A counter electrode (e.g., a cathode) of the organic light-emitting diode OLED may receive a second power supply voltage ELVSS.

Although the pixel circuit PC includes two thin-film transistors and one storage capacitor in FIG. 2, embodiments according to the present disclosure are not limited thereto. The number of thin-film transistors and the number of storage capacitors or other electrical components may be changed in various ways according to a design of the pixel circuit PC. For example, the pixel circuit PC may include three, four, five, or more thin-film transistors. In some embodiments, at least one thin-film transistor may be further provided between the first thin-film transistor T1 and the organic light-emitting diode OLED, and the first thin-film transistor T1 and the organic light-emitting diode OLED may be electrically connected to each other via the at least one thin-film transistor.

Figure 3:
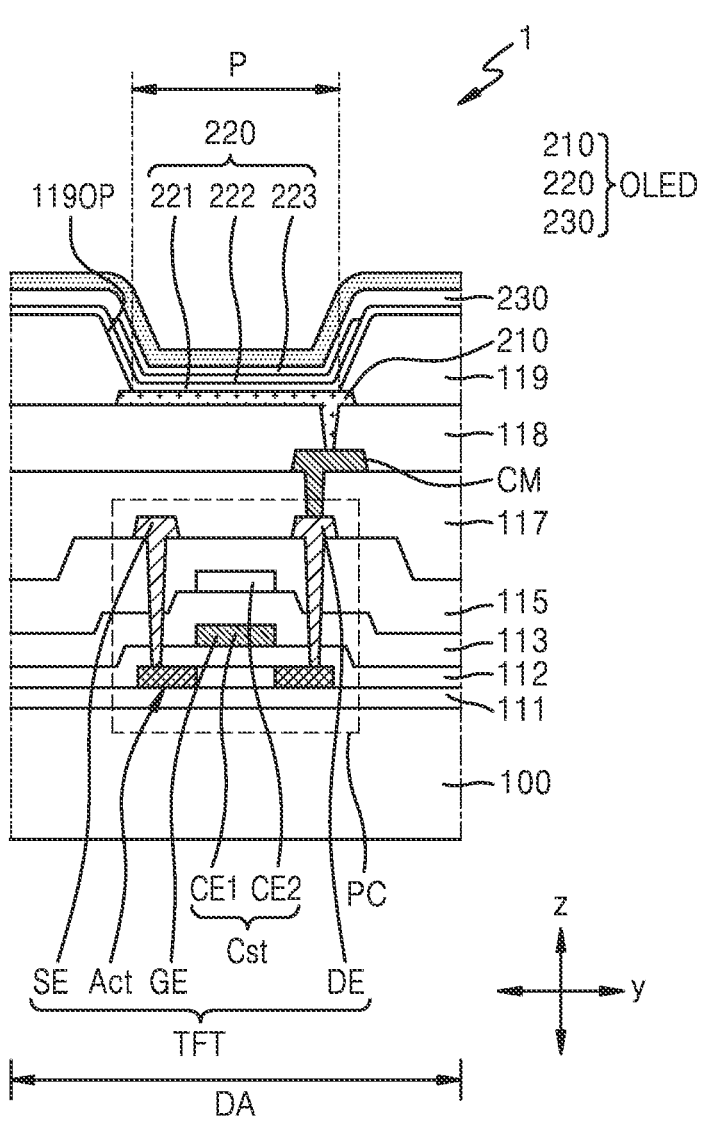
FIG. 3 is a cross-sectional view schematically illustrating a display apparatus, according to some embodiments.

FIG. 3 is a cross-sectional view schematically illustrating a display apparatus, according to some embodiments. FIG. 3 illustrates a cross-section of the display area DA.

Referring to FIG. 3, the display apparatus 1 may include a substrate 100, the pixel circuit PC located on the substrate 100, and an organic light-emitting diode OLED located on the pixel circuit PC and electrically connected to the pixel circuit PC.

The substrate 100 may include glass or a polymer resin. Examples of the polymer resin may include polyethersulfone, polyacrylate, polyether imide, polyethylene naphthalate, polyethylene terephthalate, polyphenylene sulfide, polyarylate, polyimide, polycarbonate, and cellulose acetate propionate. The substrate 100 including the polymer resin may be flexible, rollable, or bendable. The substrate 100 may have a multi-layer structure including a layer including the polymer resin and an inorganic layer.

A buffer layer 111 may reduce or block penetration of a foreign material, moisture, or external air from the bottom of the substrate 100 and may planarize the substrate 100. The buffer layer 111 may include an inorganic insulating material such as silicon oxide, silicon oxynitride, or silicon nitride, and may have a single or multi-layer structure including the above material.

The pixel circuit PC may be located on the buffer layer 111, and may include a thin-film transistor TFT and a storage capacitor Cst.

The thin-film transistor TFT may include a semiconductor layer Act, a gate electrode GE overlapping a channel region of the semiconductor layer Act, and a source electrode SE and a drain electrode DE respectively connected to a source region and a drain region of the semiconductor layer Act. A gate insulating layer 112 may be located between the semiconductor layer Act and the gate electrode GE, and a first interlayer insulating layer 113 and a second interlayer insulating layer 115 may be located between the gate electrode GE and the source electrode SE, or between the gate electrode GE and the drain electrode DE.

The storage capacitor Cst may overlap the thin-film transistor TFT. The storage capacitor Cst may include a first capacitor plate CE1 and a second capacitor plate CE2 overlapping each other. In some embodiments, the gate electrode GE of the thin-film transistor TFT may include the first capacitor plate CE1 of the storage capacitor Cst. The first interlayer insulating layer 113 may be located between the first capacitor plate CE1 and the second capacitor plate CE2.

The semiconductor layer Act may include polysilicon. In some embodiments, the semiconductor layer Act may include amorphous silicon. In some embodiments, the semiconductor layer Act may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer Act may include the channel region, and the source region and the drain region doped with impurities.

The gate insulating layer 112 may include an inorganic insulating material such as silicon oxide, silicon oxynitride, or silicon nitride, and may have a single or multi-layer structure including the above material.

The gate electrode GE or the first capacitor plate CE1 may include a metal material such as molybdenum (Mo), aluminum (Al), copper (Cu), and/or titanium (Ti), and may have a single or multi-layer structure including the above material.

The first interlayer insulating layer 113 may include an inorganic insulating material such as silicon oxide, silicon oxynitride, or silicon nitride, and may have a single or multi-layer structure including the above material.

The second capacitor plate CE2 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single or multi-layer structure including the above metal.

The second interlayer insulating layer 115 may include an inorganic insulating material such as silicon oxide, silicon oxynitride, or silicon nitride, and may have a single or multi-layer structure including the above material.

The source electrode SE and/or the drain electrode DE may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single or multi-layer structure including the above material. For example, the source electrode SE and/or the drain electrode DE may have a three-layer structure including a titanium layer, an aluminum layer, and a titanium layer.

The pixel circuit PC including the thin-film transistor TFT and the storage capacitor Cst may be electrically connected to a pixel electrode 210. According to some embodiments, as shown in FIG. 3, the pixel circuit PC and the pixel electrode 210 may be electrically connected to each other by a contact metal CM. According to some embodiments, an additional contact metal may be further located between the pixel circuit PC and the pixel electrode 210. In this case, the pixel circuit PC and the pixel electrode 210 may be electrically connected through the contact metal CM and the additional contact metal between the contact metal CM and the pixel electrode 210. Alternatively, the pixel circuit PC and the pixel electrode 210 may be directly connected to each other without the contact metal CM.

The contact metal CM may be located on a first upper insulating layer 117 and may be connected to the pixel circuit PC through a contact hole formed in the first upper insulating layer 117. The contact metal CM may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single or multi-layer structure including the above material. In some embodiments, the contact metal CM may have a three layer structure including a titanium layer, an aluminum layer, and a titanium layer.

The first upper insulating layer 117 may include an inorganic insulating material and/or an organic insulating material. The inorganic insulating material of the first upper insulating layer 117 may include silicon oxide, silicon oxynitride, or silicon nitride. The organic insulating material of the first upper insulating layer 117 may include acryl, benzocyclobutene (BCB), polyimide, or hexamethyldisiloxane (HMDSO).

A second upper insulating layer 118 may be located on the contact metal CM. The second upper insulating layer 118 may include an inorganic insulating material and/or an organic insulating material. The inorganic insulating material of the second upper insulating layer 118 may include silicon oxide, silicon oxynitride, or silicon nitride. In some embodiments, the second upper insulating layer 118 may include an organic insulating material such as acryl, benzocyclobutene (BCB), polyimide, or hexamethyldisiloxane (HMDSO).

The pixel electrode 210 may be located on the second upper insulating layer 118. The pixel electrode 210 may be connected to the contact metal CM through a contact hole of the second upper insulating layer 118.

The pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. The pixel electrode 210 may include the reflective film including the above material, and a transparent conductive film located over and/or under the reflective film. The transparent conductive film may include indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 210 may have a three-layer structure including an ITO layer, an Ag layer, and an ITO layer that are sequentially stacked.

A bank layer 119 may be located on the pixel electrode 210. The bank layer 1198 may cover an edge of the pixel electrode 210 and may include an opening 119OP overlapping a central portion of the pixel electrode 210.

The bank layer 119 may include an organic insulating material such as polyimide, polyamide, acrylic resin, benzocyclobutene, hexamethyldisiloxane (HMDSO), or phenolic resin.

An intermediate layer 220 includes an emission layer 222 overlapping the pixel electrode 210. The emission layer 222 may include an organic material. The emission layer 222 may include a high molecular weight organic material or a low molecular weight organic material emitting light of a certain color.

The intermediate layer 220 may further include at least one functional layer. For example, the intermediate layer 220 may further include a first functional layer 221 and a second functional layer 223 respectively located under and over the emission layer 222.

The first functional layer 221 may have a single or multi-layer structure. For example, when the first functional layer 221 is formed of a high molecular weight material, the first functional layer 221 may include a hole transport layer (HTL) having a single-layer structure and may be formed of poly-(3,4)-ethylene-dihydroxythiophene (PEDOT) or polyaniline (PANI). When the first functional layer 221 is formed of a low molecular weight material, the first functional layer 221 may include a hole injection layer (HIL) and a hole transport layer (HTL).

The second functional layer 223 may have a single or multi-layer structure. When the first functional layer 221 and the emission layer 222 are formed of a high molecular weight material, it may be preferable to form the second functional layer 223. The second functional layer 223 may include an electron transport layer (ETL) and/or an electron injection layer (EIL).

Each of the first functional layer 221 and the second functional layer 223 may be integrally formed to entirely cover the display area DA.

A counter electrode 230 may be formed of a conductive material having a relatively low work function. For example, the counter electrode 230 may include a (semi)transparent layer including silver (Ag), magnesium (Mg), aluminum (Al), nickel (Ni), chromium (Cr), lithium (Li), calcium (Ca), or an alloy thereof. Alternatively, the counter electrode 230 may further include a layer such as ITO, IZO, ZnO, or In$_2$O$_3$ on the (semi)transparent layer including the above material. According to some embodiments, the counter electrode 230 may include silver (Ag) and magnesium (Mg).

A stacked structure in which the pixel electrode 210, the intermediate layer 220, and the counter electrode 230 are sequentially stacked may form a light-emitting diode, for example, an organic light-emitting diode OLED. The organic light-emitting diode OLED may emit red light, green light, or blue light, and an emission area of each organic light-emitting diode OLED corresponds to a pixel. According to embodiments, because the opening 119OP of the bank layer 119 defines the emission area of the organic light-emitting diode OLED, a size and/or width of a pixel P may depend on a size and/or width of the opening 119OP of the bank layer 119.

The organic light-emitting diode OLED may be covered by an encapsulation member. The encapsulation member may include a thin-film encapsulation layer including an inorganic encapsulation layer including an inorganic insulating material and/or an organic encapsulation layer including an organic insulating material, or an encapsulation substrate such as a glass substrate.

Figure 4A:
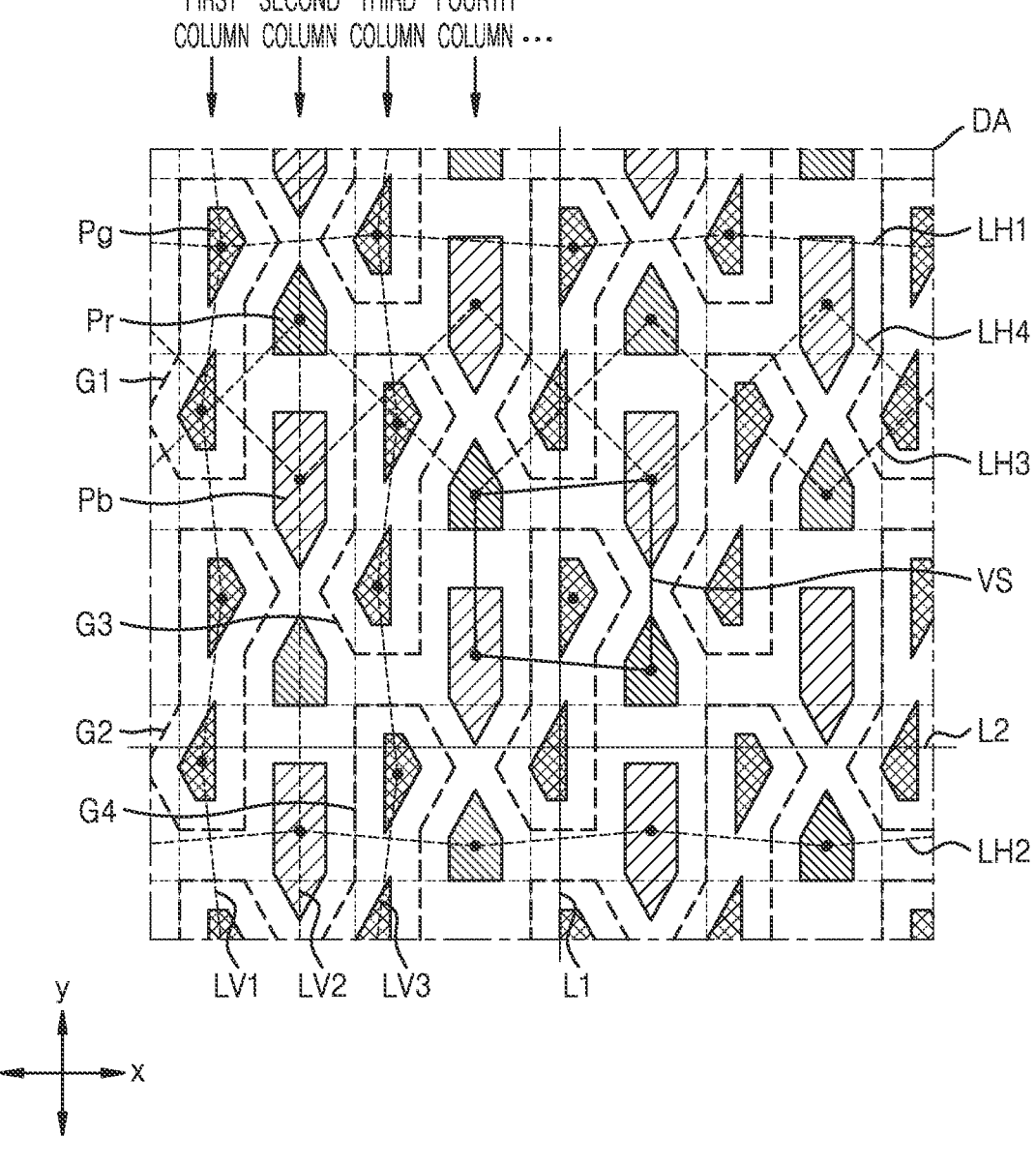
FIGS. 4A and 4B are plan views illustrating an arrangement of pixels of a portion of a display apparatus, according to some embodiments.
Figure 4B:
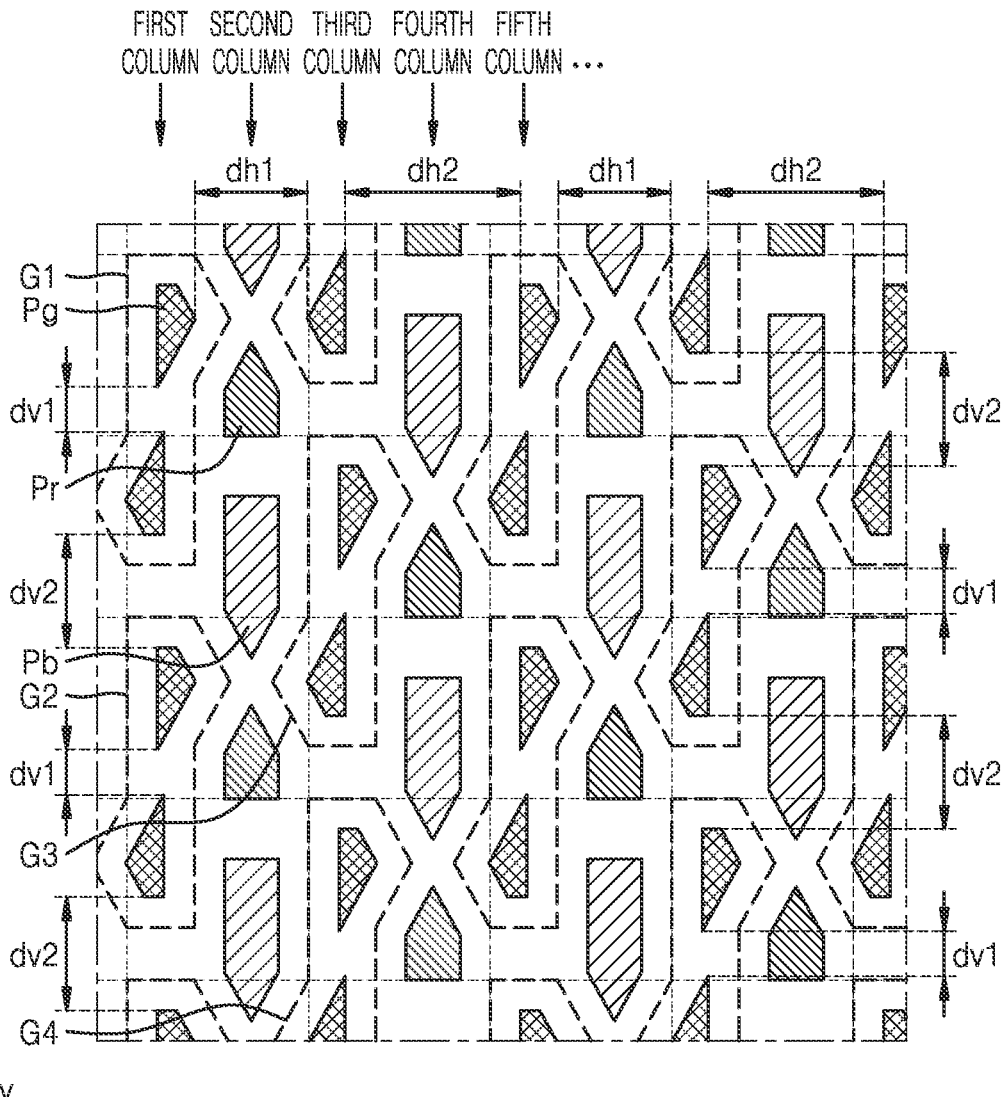
Figure 4B:
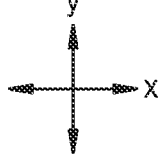

FIGS. 4A and 4B are plan views illustrating an arrangement of pixels of a portion of a display apparatus, according to some embodiments.

Referring to FIGS. 4A and 4B, an array of pixels that are two-dimensionally arranged in a first direction (e.g., an x direction) and a second direction (e.g., a y direction) may define the display area DA. The pixels of the array may include a first pixel of a first color, a second pixel of a second color, and a third pixel of a third color. According to some embodiments, the first pixel may be a green pixel Pg that may emit green light, the second pixel may be a red pixel Pr that may emit red light, and the third pixel may be a blue pixel Pb that may emit blue light.

The array of pixels may include a plurality of columns (or pixel columns) in the second direction (e.g., the y direction). From among the first through third pixels of different colors, the second pixel and the third pixel may be arranged in the same column, and the first pixel may be located in a different column. For example, the red pixel Pr and the blue pixel Pb may be arranged in the same column, and the green pixel Pg may be located in a different column.

The array of pixels may include a first column of green pixels Pg, a second column of blue pixels Pb and red pixels Pr, a third column of green pixels Pg, and a fourth column of red pixels Pr and blue pixels Pb, and the first through fourth columns may be repeatedly arranged.

In the first column, the green pixels Pg may be arranged to be spaced apart from each other in the second direction (e.g., the y direction). A virtual line connecting centroids of the green pixels Pg of the first column may have a zigzag shape. Centroids of the green pixels Pg of the first column may be located on a virtual zigzag line LV1 having a zigzag shape in the second direction (e.g., the y direction). In the specification, a centroid of a pixel may refer to a geometric centroid of a shape of the pixel.

The green pixels Pg of the first column may at least partially overlap each other in the second direction. When the green pixels Pg of the first column overlap each other in the second direction, it may mean that planar shapes of the green pixels Pg of the first column overlap each other when viewed in the second direction. In other words, a virtual straight line L1 extending in the second direction may pass through the green pixels Pg of the first column.

According to some embodiments, because centroids of the green pixels Pg of the first column are arranged in a zigzag shape in the second direction and the green pixels Pg of the first column overlap each other in the second direction, visibility may be improved when an image such as a straight line is displayed in the display area DA.

The first column may have a structure in which two green pixels Pg having different shapes are repeatedly arranged. For example, in FIG. 4A, two adjacent green pixels Pg may form one group, and the first column may have a structure in which a plurality of groups each including two green pixels Pg are repeatedly arranged in the second direction (e.g., the y direction). FIGS. 4A and 4B illustrate a first pixel group G1 and a second pixel group G2 each including two green pixels Pg in the first column.

In a second column, the red pixel Pr and the blue pixel Pb may be alternately arranged. The red pixel Pr and the blue pixel Pb that are adjacent to each other may be spaced apart from each other in the second direction (e.g., the y direction).

Centroids of the red pixels Pr and centroids of the blue pixels Pb of the second column may be located on a virtual straight line LV2 extending in the second direction (e.g., the y direction).

In a third column, the green pixels Pg may be located to be spaced apart from each other in the second direction (e.g., the y direction). Like in the first column, centroids of the green pixels Pg of the third column may be located on a virtual zigzag line LV3 having a zigzag shape in the second direction (e.g., the y direction). Adjacent green pixels Pg of the third column may at least partially overlap each other in the second direction (e.g., the y direction).

Like in the first column, the third column may have a structure in which two green pixels Pg having different shapes are repeatedly arranged. For example, in FIG. 4A, two adjacent green pixels Pg may form one group, and the third column may have a structure in which a plurality of groups each including two green pixels Pg are repeatedly arranged in the second direction (e.g., the y direction). FIGS. 4A and 4B illustrate a third pixel group G3 and a fourth pixel group G4 each including two green pixels Pg in the third column.

The green pixels Pg of the third column may be shifted by a certain interval in the second direction (e.g., the y direction) compared to the green pixels Pg of the first column. For example, the green pixels Pg of the third column may be shifted by about one pixel interval compared to the green pixels Pg of the first column. For example, a first green pixel Pg of the third pixel group G3 of the third column may correspond to a second green pixel Pg of the first pixel group G1 of the first column, and a second green pixel Pg of the third pixel group G3 may correspond to a first green pixel Pg of the second pixel group G2 of the first column.

The green pixels Pg of the first column and the green pixels Pg of the third column may be arranged in the same row. Centroids of the green pixels Pg of the first column and centroids of the green pixels Pg of the third column arranged in the same row may be located on a virtual zigzag line LH1 having a zigzag shape in the first direction (e.g., the x direction). The green pixels Pg of the same row may at least partially overlap each other in the first direction (e.g., the x direction). When the green pixels Pg of the same row overlap each other in the first direction, it may mean that planar shapes of the green pixels Pg of the same row overlap each other when viewed in the first direction. In other words, a virtual straight line L2 extending in the first direction may pass through the green pixels Pg of the same row.

According to some embodiments, because centroids of the green pixels Pg of the same row are located in a zigzag shape in the first direction (e.g., the x direction) and adjacent green pixels Pg of the same row overlap each other in the first direction (e.g., the x direction), visibility may be improved when a straight line image or the like is displayed in the display area DA. Accordingly, an aperture ratio of a pixel may be secured and excellent visibility may be maintained by arranging pixels in a zigzag shape.

In a fourth column, the red pixel Pr and the blue pixel Pb may be alternately arranged. The red pixel Pr and the blue pixel Pb that are adjacent to each other may be spaced apart from each other in the second direction (e.g., the y direction). Centroids of the red pixels Pr and centroids of the blue pixels Pb of the fourth column may be located on the virtual straight line LV2 extending in the second direction (e.g., the y direction).

The red pixels Pr of the second column and the blue pixels Pb of the fourth column may be arranged in the same row in the first direction (e.g., the x direction). Likewise, the blue pixels Pb of the second column and the red pixels Pr of the fourth column may be arranged in the same row in the first direction (e.g., the x direction). Centroids of the red pixels Pr and centroids of the blue pixels Pb arranged in the same row may be located on a virtual zigzag line LH2 having a zigzag shape in the first direction (e.g., the x direction).

The red pixels Pr of the second column and the red pixels Pr of the fourth column may be arranged in different rows. Centroids of the red pixels Pr of the second column and centroids of the red pixels Pr of the fourth column may be located on a virtual zigzag line LH3 having a zigzag shape in the first direction (e.g., the x direction). Likewise, the blue pixels Pb of the second column and the blue pixels Pb of the fourth column may be arranged in different rows. Centroids of the blue pixels Pb of the second column and centroids of the blue pixels Pb of the fourth column may be located on a virtual zigzag line LH4 having a zigzag shape in the first direction (e.g., the x direction).

When a pixel arrangement structure of FIG. 4A is differently expressed, the green pixels Pg, the red pixels Pr, and the blue pixels Pb may be arranged in a pentile structure. For example, the green pixels Pg, the red pixels Pr, and the blue pixels Pb may be arranged in a diamond pentile structure. From among vertexes of a virtual quadrangle VS surrounding a centroid of each green pixel Pg, the red pixels Pr may be located at vertexes facing each other and the blue pixels Pb may be located at the remaining vertexes.

Referring to FIG. 4B, a distance between the green pixels Pg of the first column may vary according to a position. A distance between pixels may refer to a distance between edges (or vertexes) of the pixels. A first shortest distance dv1 between two adjacent green pixels Pg from among the green pixels Pg of the first column may be different from a second shortest distance dv2 between two other adjacent green pixels Pg. For example, the first shortest distance dv1 between adjacent green pixels Pg included in each pixel group may be different from the second shortest distance dv2 between a pixel group and a pixel group. For example, the first shortest distance between the green pixels Pg included in the first pixel group G1 may be less than the second shortest distance dv2 between the first pixel group G1 and the second pixel group G2. Likewise, the first shortest distance dv1 between the green pixels Pg included in the second pixel group G2 may be less than the second shortest distance dv2 between the first pixel group G1 and the second pixel group G2. The second shortest distance dv2 between the first pixel group G1 and the second pixel group G2 may correspond to a shortest distance between the green pixel Pg close to the second pixel group G2 from among the green pixels Pg of the first pixel group G1 and the green pixel Pg close to the first pixel group G1 from among the green pixels Pg of the second pixel group G2.

Like in the first column, a distance between the green pixels Pg of the third column may vary according to a position. The first shortest distance dv1 between two adjacent green pixels Pg from among the green pixels Pg of the third column may be different from the second shortest distance dv2 between two other adjacent green pixels Pg. The first shortest distance dv1 between adjacent green pixels Pg included in each pixel group may be less than the second shortest distance dv2 between a pixel group and a pixel group. For example, the first shortest distance dv1 between the green pixels Pg included in the third pixel group G3 may be less than the second shortest distance dv2 between the third pixel group G3 and the fourth pixel group G4. Likewise, the first shortest distance dv1 between the green pixels Pg included in the third pixel group G3 may be less than the second shortest distance dv2 between the third pixel group G3 and the fourth pixel group G4. The second shortest distance dv2 between the third pixel group G3 and the fourth pixel group G4 may correspond to a shortest distance between the green pixel Pg close to the fourth pixel group G4 from among the green pixels Pg of the third pixel group G3 and the green pixel Pg close to the third pixel group G3 from among the green pixels Pg of the fourth pixel group G4.

A third shortest distance dh1 between two green pixels Pg adjacent to each other in the first direction (e.g., the x direction) from among the green pixels Pg may be different from a fourth shortest distance dh2 between two other green pixels Pg adjacent to each other in the first direction (e.g., the x direction) from among the green pixels Pg. For example, the third shortest distance dh1 between the green pixel Pg of the first column and the green pixel Pg of the third column which are arranged in the same row may be different from the fourth shortest distance dh2 between the green pixel Pg of the third column and the green pixel Pg of the fifth column which are arranged in the same row. In FIG. 4B, the third shortest distance dh1 between the green pixel Pg of the first column and the green pixel Pg of the third column which are arranged in the same row is less than the fourth shortest distance dh2 between the green pixel Pg of the third column and the green pixel Pg of the fifth column which are arranged in the same row. However, embodiments according to the present disclosure are not limited thereto. In some embodiments, the third shortest distance dh1 between the green pixel Pg of the first column and the green pixel Pg of the third column which are arranged in the same row may be greater than the fourth shortest distance dh2 between the green pixel Pg of the third column and the green pixel Pg of the fifth column which are arranged in the same row.

Figure 5:
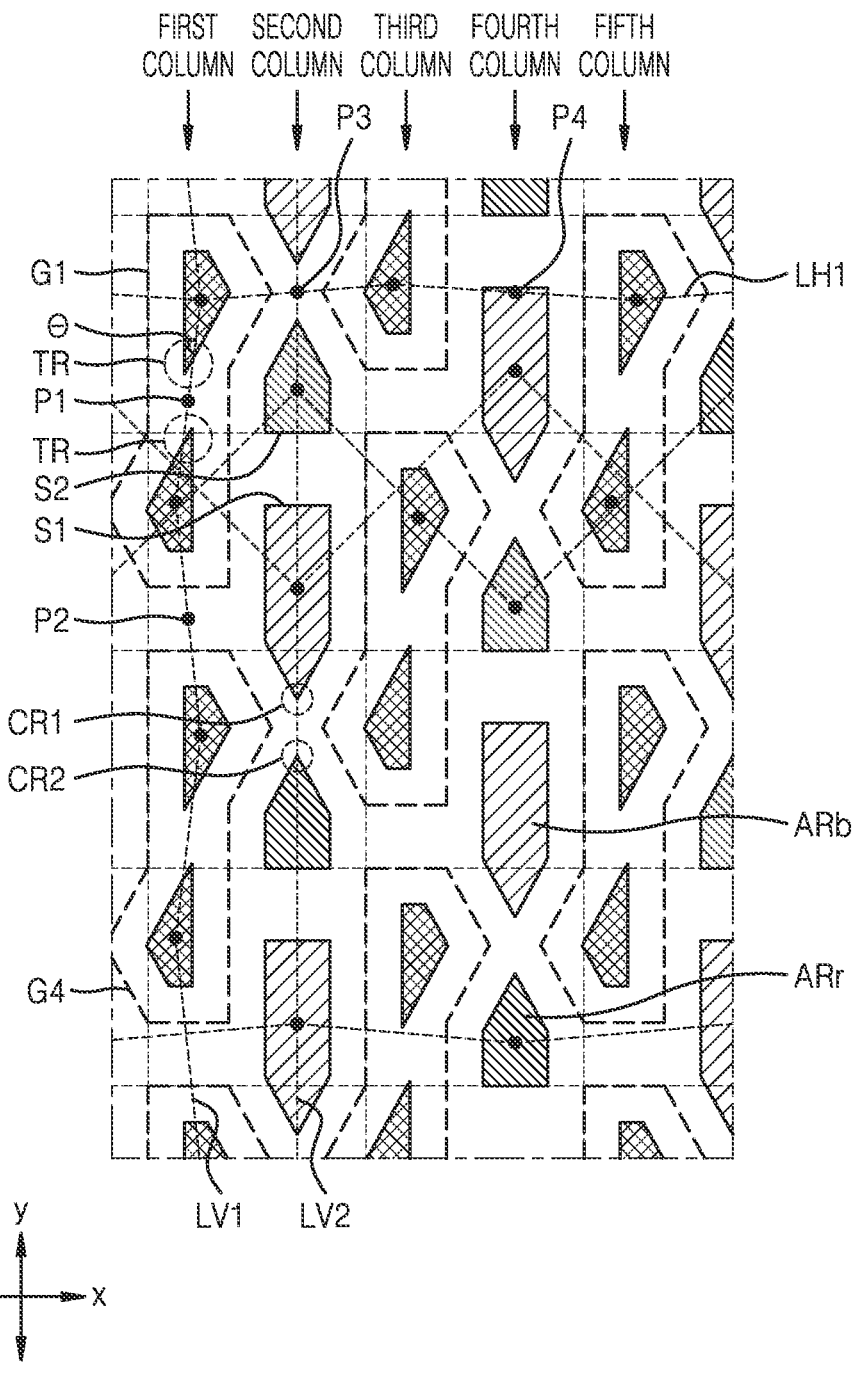
FIG. 5 is a plan view illustrating some of the pixels of FIG. 4A.

FIG. 5 is a plan view illustrating some of the pixels of FIG. 4A.

Referring to FIG. 5, the green pixel Pg, the red pixel Pr, and the blue pixel Pb may be designed to have a pixel arrangement structure as described with reference to FIGS. 4A and 4B and ensure a high aperture ratio. Each of the green pixel Pg, the red pixel Pr, and the blue pixel Pb may have a polygonal shape. When a pixel has a polygonal shape, the pixel may have a shape such as a substantially polygonal shape with a rounded vertex portion. At least one of the green pixel Pg, the red pixel Pr, or the blue pixel Pb may have at least five internal angles. According to some embodiments, the green pixel Pg may have a quadrangular shape, and each of the red pixel Pr and the blue pixel Pb may have a pentagonal shape. As described below with reference to FIG. 9A, in some embodiments, each of the green pixel Pg, the red pixel Pr, and the blue pixel Pb may have a pentagonal shape.

According to some embodiments, the green pixel Pg may have a quadrangular shape in which one of internal angles is an acute angle. That is, the green pixel Pg may include a corner portion TR having an acute angle. A size of an internal angle $\theta$ of the corner portion TR of the green pixel Pg may be greater than 0° and less than 80°, preferably greater than 0° and less than 60°. In the first column, the corner portions TR of the green pixels Pg included in the same group may face each other. For example, the corner portions TR of the green pixels Pg of the first pixel group G1 may face each other. According to some embodiments, because the green pixel Pg includes the corner portion TR having an acute angle, an aperture ratio of a pixel may be increased.

Two adjacent green pixels Pg from among the green pixels Pg may be symmetric to each other with respect to a reference point on a virtual straight line that connects centroids of the two green pixels Pg. For example, the green pixels Pg of the first pixel group G1 from among the green pixels Pg of the first column may be symmetric to each other with respect to a reference point P1 on a virtual straight line that connects centroids of the green pixels Pg. The green pixel Pg of the first pixel group G1 and the green pixel Pg of the second pixel group G2 which are adjacent to each other may be symmetric to each other with respect to a reference point P2 on a virtual straight line that connects centroids of the green pixels Pg. The reference points P1 and P2 may be located on the virtual zigzag line LV1.

Also, for example, the green pixel Pg of the first column and the green pixel Pg of the third column which are adjacent to each other from among the green pixels Pg of the same row may be symmetric to each other with respect to a reference point P3 on a virtual straight line that connects centroids of the green pixels Pg. The green pixel Pg of the third column and the green pixel Pg of the fifth column which are adjacent to each other from among the green pixels Pg of the same row may be symmetric to each other with respect to a reference point P4 on a virtual straight line that connects centroids of the green pixels Pg. The reference points P3 and P4 may be located on the virtual zigzag line LH1.

Referring to FIG. 5, the red pixels Pr and the blue pixels Pb arranged in the same column may be formed so that both sides are symmetric to each other with respect to the virtual straight line LV2 passing through centroids of the red pixels Pr and centroids of the blue pixels Pb of the second column. According to some embodiments, each of the red pixel Pr and the blue pixel Pb may have a symmetrical pentagonal shape in which at least two internal angles are right angles.

The red pixel Pr and the blue pixel Pb may not be symmetric to each other and may have different areas (or widths). In FIG. 5, an area (or width) ARb of the blue pixel Pb is greater than an area (or width) ARr of the red pixel Pr. In general, because luminous efficiency of the blue pixel Pb is less than luminous efficiency of the red pixel Pr or luminous efficiency of the green pixel Pg in the same area, the area of the blue pixel Pb may be greater than that of the red pixel Pr. However, in some embodiments, the area ARr of the red pixel Pr may be greater than the area (or width) ARb of the blue pixel Pb.

Any one blue pixel Pb from among the blue pixels Pb of the second column may be located between two red pixels Pr from among the red pixels Pr of the second column. In this case, an edge S1 of the any one blue pixel Pb may face an edge S2 of any one red pixel Pr from among the two red pixels Pr. The edge S1 of the blue pixel Pb and the edge S2 of the red pixel Pr which face each other may be straight line edges extending in the first direction (e.g., the x direction). A length of the edge S1 of the blue pixel Pb and a length of the edge S2 of the red pixel Pr which face each other may be substantially the same. However, embodiments according to the present disclosure are not limited thereto. In some embodiments, lengths of the edge S1 of the blue pixel Pb and the edge S2 of the red pixel Pr which face each other may be different from each other.

A corner portion CR1 of the any one blue pixel Pb may face a corner portion CR2 of the other red pixel Pr from among the two red pixels Pr. Each of the corner portion CR1 of the blue pixel Pb and the corner portion CR2 of the red pixel Pr which face each other may have a sharp shape. In some embodiments, the corner portion CR1 of the blue pixel Pb and/or the corner portion CR2 of the red pixel Pr may have a rounded shape. In this case, the blue pixel Pb and/or the red pixel Pr may have a pentagonal shape with one rounded vertex portion. Alternatively, in some embodiments, the corner portion CR1 of the blue pixel Pb and/or the corner portion CR2 of the red pixel Pr may be removed. In this case, each of the blue pixel Pb and/or the red pixel Pr may have a hexagonal shape.

As shown in FIG. 5, each of the green pixel Pg, the red pixel Pr, and the blue pixel Pb may include inclined edges oblique to the first direction (e.g., the x direction) and the second direction (e.g., the y direction). Any one of the inclined edges of the green pixel Pg may face any one of the inclined edges of the red pixel Pr adjacent to the green pixel Pg. The other one of the inclined edges of the green pixel Pg may face any one of the inclined edges of the blue pixel Pb adjacent to the green pixel Pg. Also, from the viewpoint of the red pixel Pr, any one of the inclined edges of the red pixel Pr may face any one of the inclined edges of the green pixel Pg adjacent to the red pixel Pr. The other one of the inclined edges of the red pixel Pr may face any one of the inclined edges of another green pixel Pg adjacent to the red pixel Pr. Also, from the viewpoint of the blue pixel Pb, any one of the inclined edges of the blue pixel Pb may face any one of the inclined edges of the green pixel Pg adjacent to the blue pixel Pb. The other one of the inclined edges of the blue pixel Pb may face any one of the inclined edges of another green pixel Pg adjacent to the blue pixel Pb.

Figure 6A:
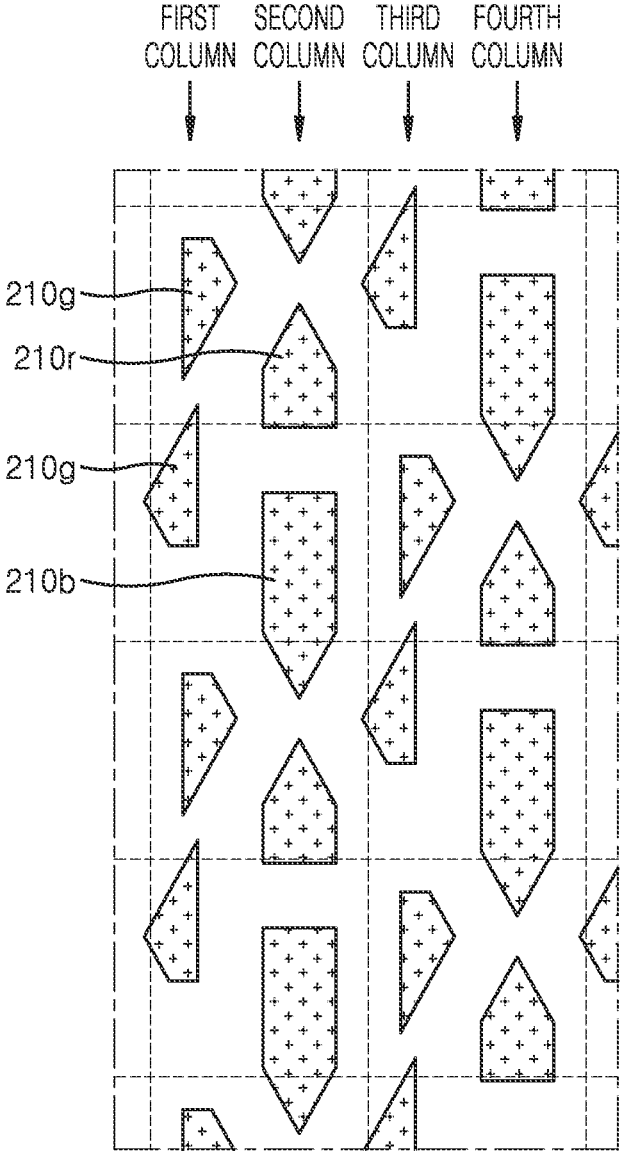
FIGS. 6A, 6B, and 6C are plan views illustrating a part of a process of forming a display apparatus, according to some embodiments.
Figure 6A:
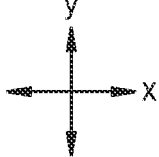
Figure 6B:
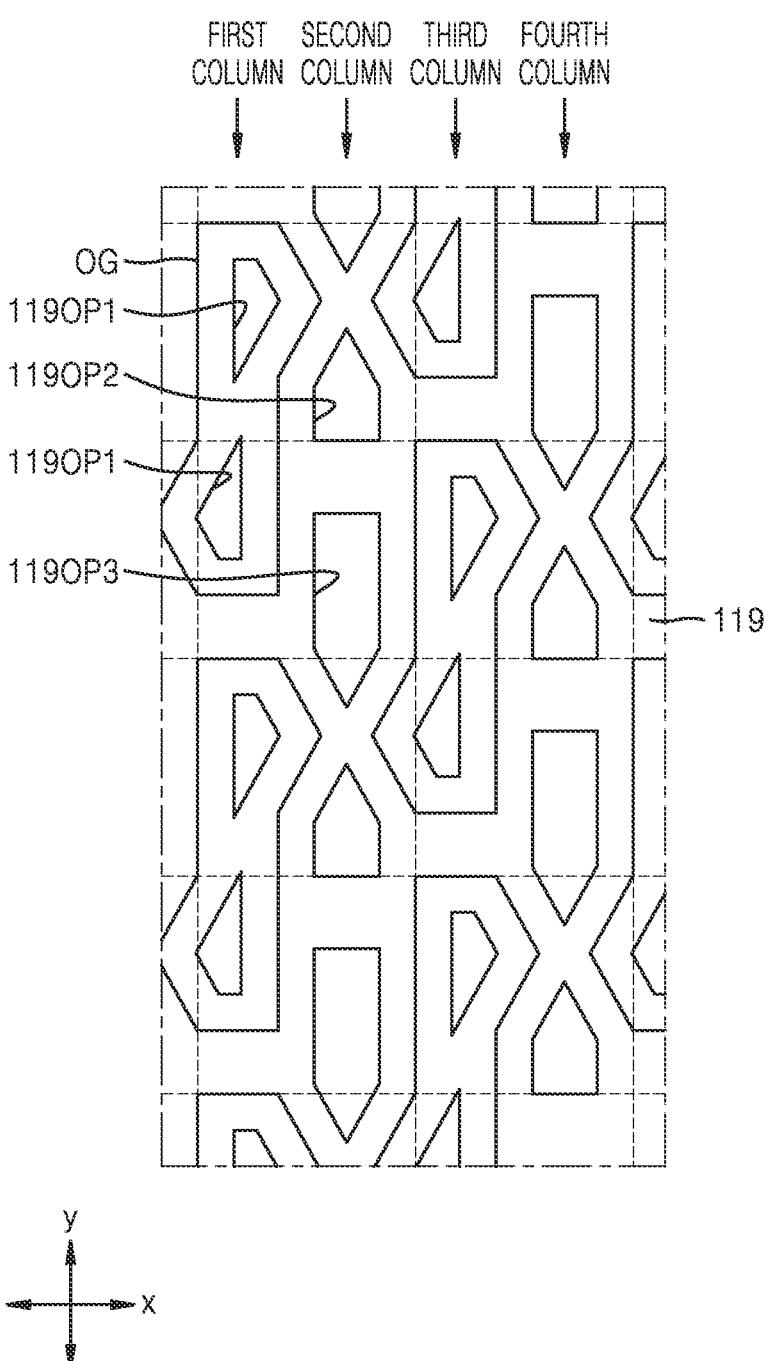
Figure 6C:
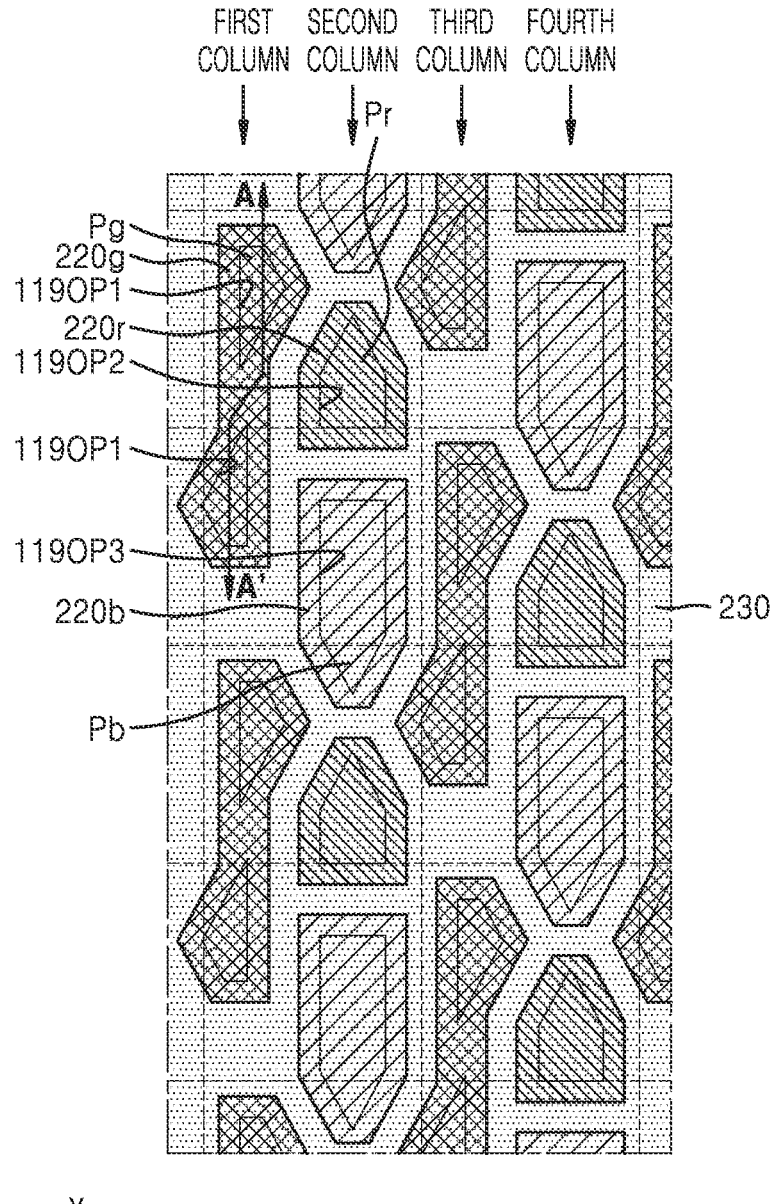
Figure 6C:
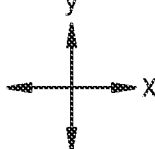
Figure 7A:
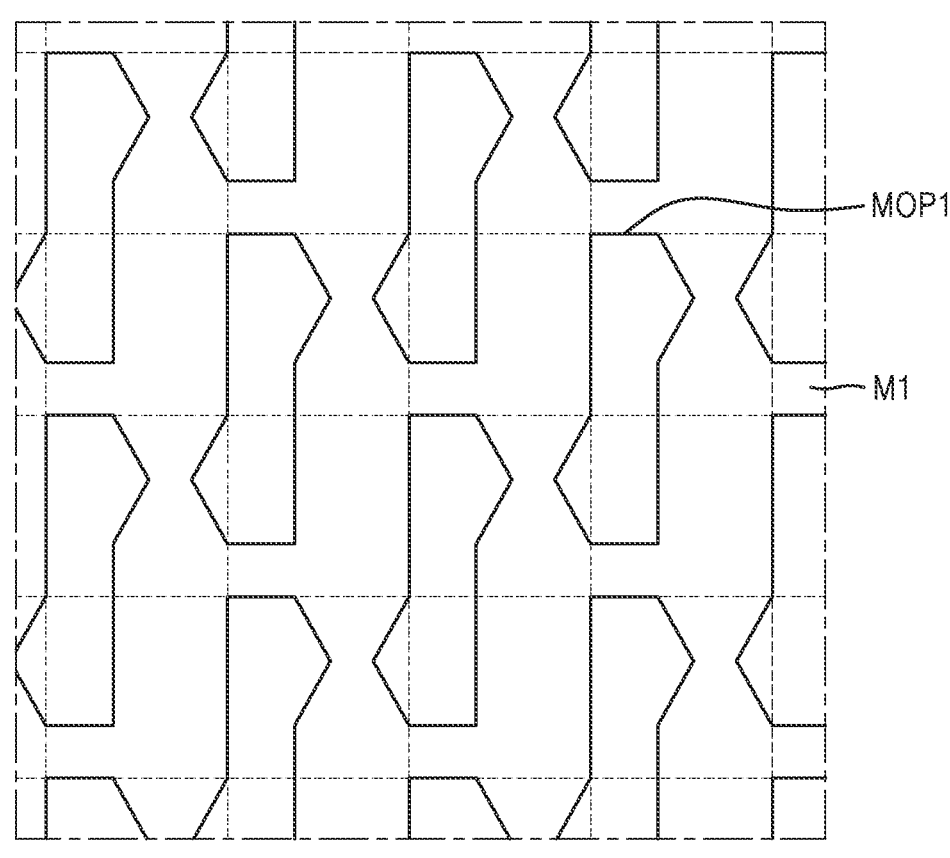
FIGS. 7A, 7B, and 7C are plan views illustrating a mask sheet used to form a display apparatus, according to some embodiments.
Figure 7A:
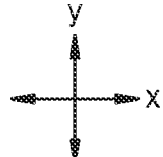
Figure 7B:
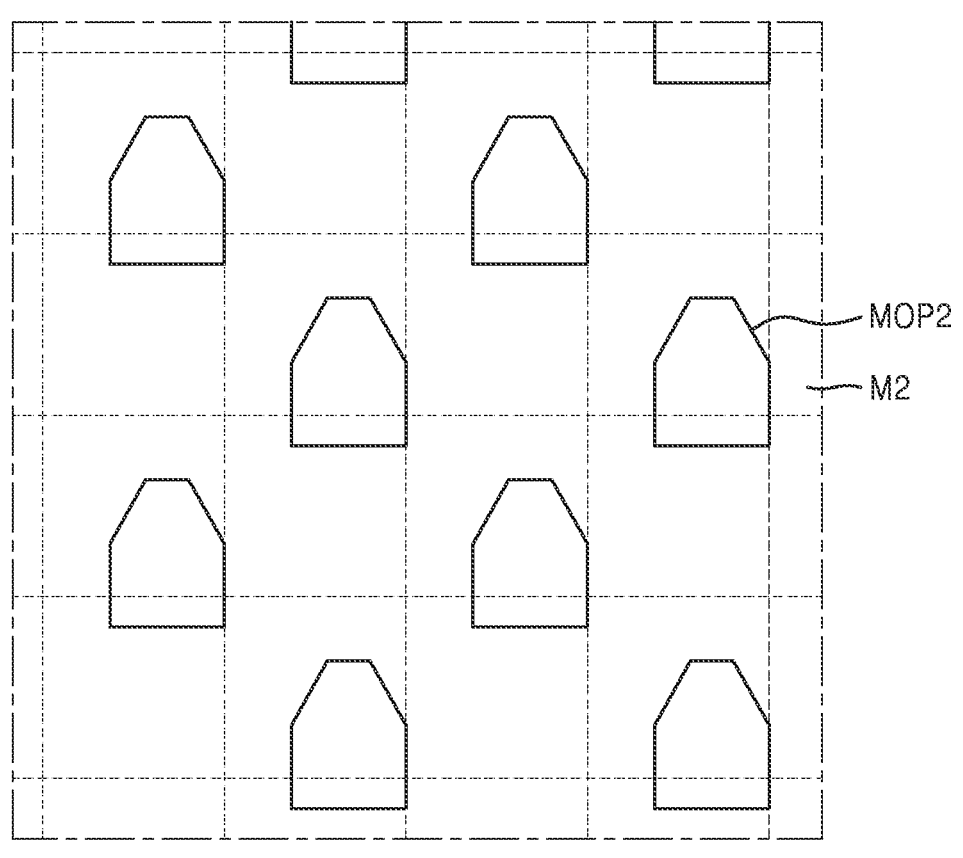
Figure 7B:
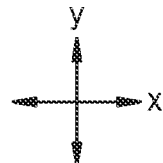
Figure 7C:
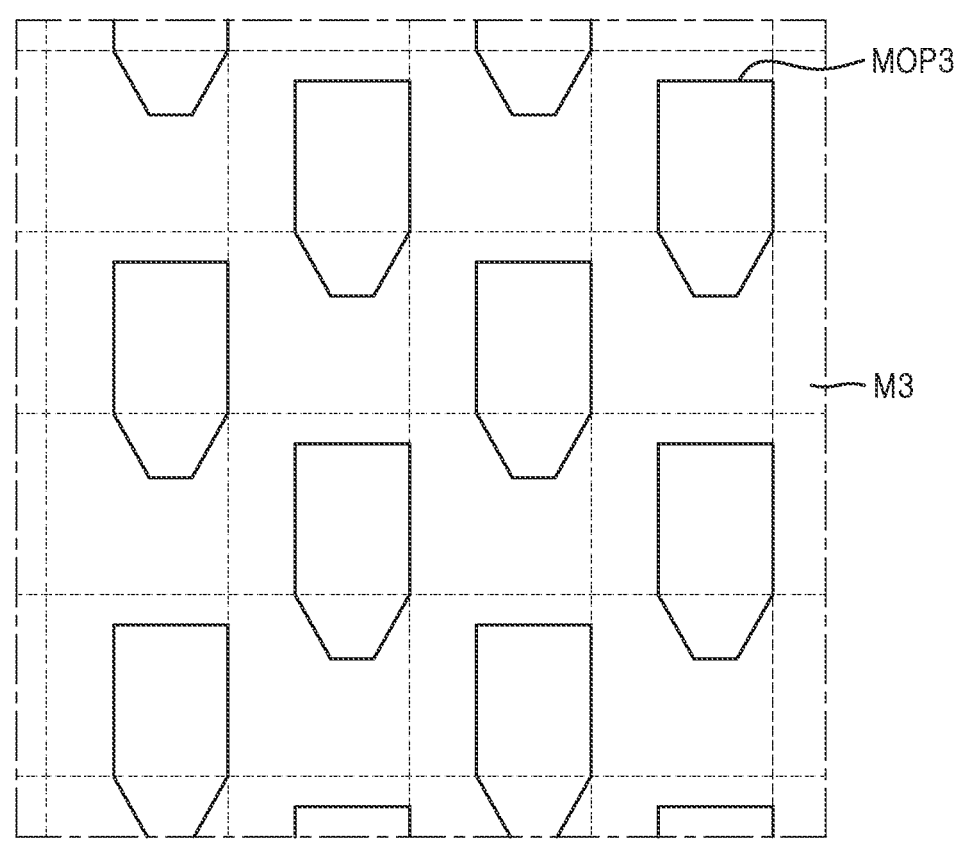
Figure 7C:
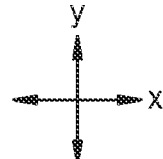

FIGS. 6A, 6B, and 6C are plan views illustrating a part of a process of forming a display apparatus, according to some embodiments. Also, FIGS. 7A, 7B, and 7C are plan views illustrating a portion of a mask sheet used to form a display apparatus, according to some embodiments.

Referring to FIG. 6A, pixel electrodes may be arranged along each column. First pixel electrodes 210$g$ corresponding to green pixels may be spaced apart from each other in the second direction (e.g., the y direction) to form one column. Second pixel electrodes 210$r$ corresponding to red pixels and third pixel electrodes 210$b$ corresponding to blue pixels may be spaced apart from each other in the second direction to form another column. In this case, the second pixel electrode 210$r$ and the third pixel electrode 210$b$ may be alternately arranged in the second direction.

FIG. 6A illustrate a first column of the first pixel electrodes 210$g$, a second column of the second pixel electrodes 210$r$ and the third pixel electrodes 210$b$, a third column of the first pixel electrodes 210$g$, and a fourth column of the second pixel electrodes 210$r$ and the third pixel electrodes 210$b$, and the first through fourth columns may be repeatedly arranged in the first direction (e.g., the x direction). The first pixel electrode 210$g$, the second pixel electrode 210$r$, and the third pixel electrode 210$b$ may respectively correspond to shapes and positions of a red pixel, a green pixel, and a blue pixel described with reference to FIGS. 4A, 4B, and 5.

An area (or width) of the first pixel electrode 210$g$ may be greater than an area (or width) of the green pixel. The green pixel may be located inside the first pixel electrode 210$g$ in a plan view. An area (or width) of the second pixel electrode 210$r$ may be greater than an area (or width) of the red pixel. The red pixel may be located inside the second pixel electrode 210$r$ in a plan view. An area (or width) of the third pixel electrode 210$b$ may be greater than an area (or width) of the blue pixel. The blue pixel may be located inside the third pixel electrode 210$b$ in a plan view.

Referring to FIG. 6B, the bank layer 119 may be formed on the first through third pixel electrodes 210$g$, 210$r$, and 210$b$. The bank layer 119 may include first through third openings 119OP1, 119OP2, and 119OP3 respectively overlapping the first through third pixel electrodes 210$g$, 210$r$, and 210$b$. The first openings 119OP1 from among the first through third openings 119OP1, 119OP2, and 119OP3 may be arranged in the second direction to form one column. The second openings 119OP2 and the third openings 119OP3 may be alternately arranged in the second direction to form another column.

FIG. 6B illustrates a first column of the first openings 119OP1, a second column of the second openings 119OP2 and the third openings 119OP3 that are alternately arranged, a third column of the first openings 119OP1, and a fourth column of the second openings 119OP2 and the third openings 119OP3 that are alternately arranged, and the first through fourth columns may be repeatedly arranged in the first direction (e.g., the x direction). The first opening 119OP1, the second opening 119OP2, and the third opening 119OP3 of the bank layer 119 may respectively correspond to shapes and positions of the green pixel, the red pixel, and the blue pixel described with reference to FIGS. 4A, 4B, and 5.

In the first column and the third column, a distance between the first openings 119OP1 may vary according to a position. For example, the first openings 119OP1 may be arranged so that every two first openings 119OP1 are adjacent to each other in the second direction (e.g., the y direction). Two adjacent first openings 119OP1 may form one opening group OG. The first column or the third column may have a structure in which a plurality of opening groups OG each including two first openings 119OP1 are repeatedly arranged.

As described below, each pixel is an area where light is emitted, and the area where light is emitted may be defined by an opening of the bank layer 119 through which a pixel electrode is exposed. Accordingly, an area of the opening of the bank layer 119B may correspond to an aperture ratio (or area) of each pixel. An area (or width) of the first opening 119OP1 may be substantially the same as an area (or width) of the green pixel. An area (or width) of the second opening 119OP2 may be substantially the same as an area (or width) of the red pixel. An area (or width) of the third opening 119OP3 may be substantially the same as an area (or width) of the blue pixel.

Referring to FIG. 6C, first through third emission layers 222$g$, 222$r$, and 222$b$ may be formed on the bank layer 119. The first emission layer 222$g$ corresponding to the green pixel Pg, the second emission layer 222$r$ corresponding to the red pixel Pr, and the third emission layer 222$b$ corresponding to the blue pixel Pb may be spaced apart from one another.

The first emission layer 222$g$ may be formed to correspond to two first openings 119OP1. The first emission layer 222$g$ overlapping the two first openings 119OP1 may be spaced apart from another first emission layer 222$g$ overlapping other two first openings 119OP1. Two first openings 119OP1 corresponding to one first emission layer 222$g$ may be included in the same opening group OG (see FIG. 6B).

The first emission layers 222$g$ may be formed by using, for example, a first mask sheet M1 (see FIG. 7A). The first mask sheet M1 may include a plurality of first opening portions MOP1 that are two-dimensionally arranged. The first emission layers 222$g$ may be formed by depositing a deposition material through the first opening portions MOP1 of the first mask sheet M1. Shapes and positions of the first opening portions MOP1 may correspond to shapes and positions of the first emission layers 222$g$ to be formed.

The second emission layers 222$r$ may be respectively formed for the second openings 119OP2. Likewise, the third emission layers 222$b$ may be respectively formed for the third openings 119OP3. The second emission layers 222$r$ and the third emission layers 222$b$ may be respectively formed by using, for example, a second mask sheet M2 (see FIG. 7B) and a third mask sheet M3 (see FIG. 7C). The second mask sheet M2 may include a plurality of second opening portions MOP2, and the second emission layers 222$r$ may be formed by depositing a deposition material through the second opening portions MOP2. Shapes and positions of the second opening portions MOP2 may correspond to shapes and positions of the second emission layers 222$r$. The third mask sheet M3 may include a plurality of third opening portions MOP3, and the third emission layers 222$b$ may be formed by depositing a deposition material through the third opening portions MOP3. The third opening portions MOP3 may correspond to shapes and positions of the third emission layers 222$b$.

An area (or width) of the first emission layer 222$g$ may be greater than an area (or width) of the green pixel Pg. The green pixel Pg may be located inside the first emission layer 222$g$ in a plan view. An area (or width) of the second emission layer 222$r$ may be greater than an area (or width) of the red pixel Pr. The red pixel Pr may be located inside the second emission layer 222$r$ in a plan view. An area (or width) of the third emission layer 222b may be greater than an area (or width) of the blue pixel Pb. The blue pixel Pb may be located inside the third emission layer 222b in a plan view.

Next, the counter electrode 230 may be formed on the first through third emission layers 222g, 222r, and 222b. The counter electrode 230 may be integrally formed to entirely cover the first through third emission layers 222g, 222r, and 222b or to entirely cover the display area.

Referring to FIGS. 6A through 6C, the first pixel electrode 210g, the first emission layer 222g, and the counter electrode 230 sequentially stacked through the first opening 119OP1 may form an organic light-emitting diode that may emit red light. Likewise, the second pixel electrode 210r, the second emission layer 222r, and the counter electrode 230 sequentially stacked through the second opening 119OP2 may form an organic light-emitting diode that may emit red light. The third pixel electrode 210b, the third emission layer 222b, and the counter electrode 230 sequentially stacked through the third opening 119OP3 may form an organic light-emitting diode that emit blue light.

Figure 8:
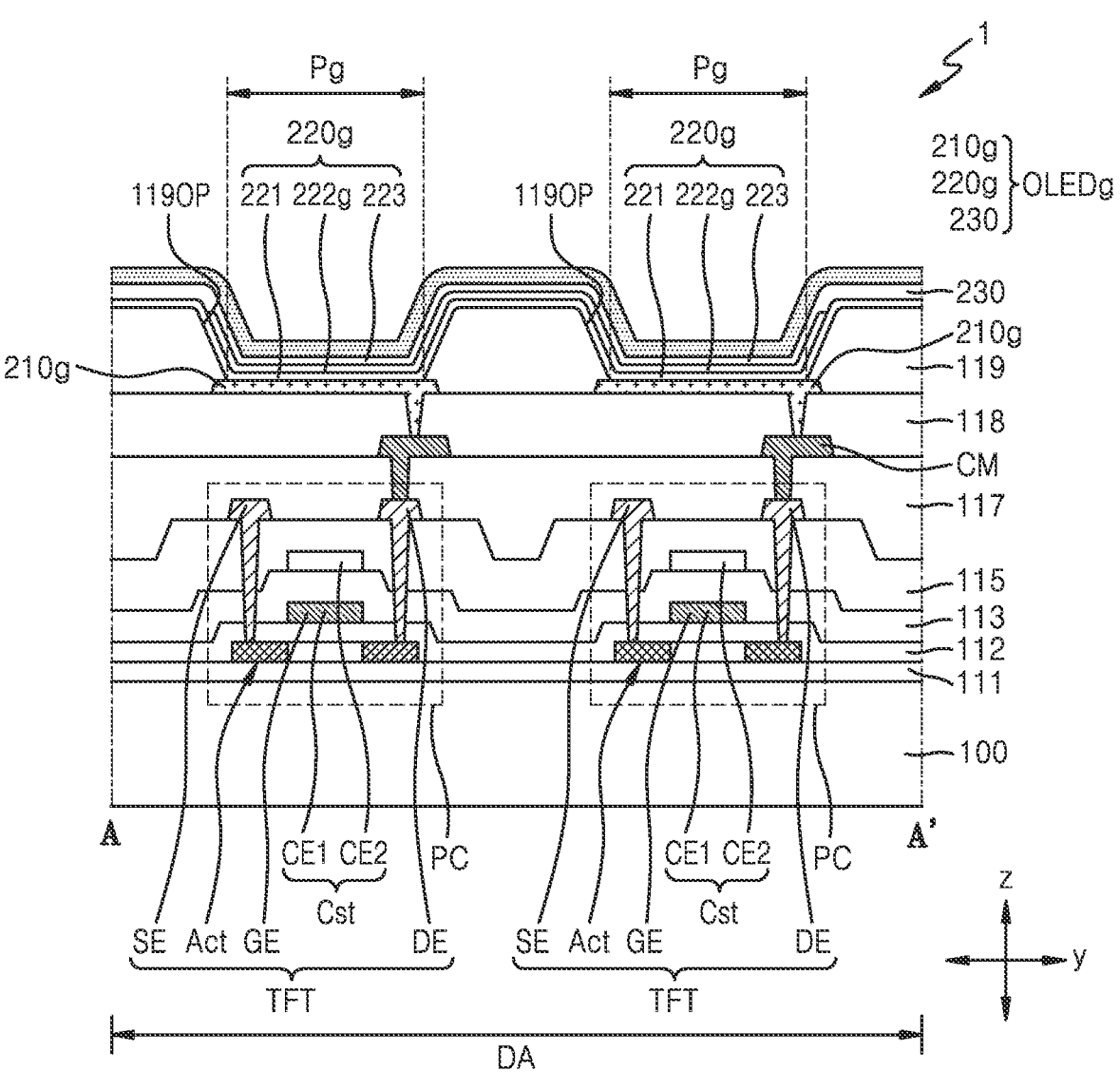
FIG. 8 is a cross-sectional view taken along line A-A' of FIG. 6C.

FIG. 8 is a cross-sectional view taken along line A-A' of FIG. 6C.

Referring to FIG. 8, the buffer layer 111 may be formed on the substrate 100, and the pixel circuit PC may be formed on the buffer layer 111. A specific structure of the pixel circuit PC, insulating layers between elements of the pixel circuit PC, and the first upper insulating layer 117, the contact metal CM, and the second upper insulating layer 118 on the pixel circuit PC are the same as those described with reference to FIG. 3.

The first pixel electrodes 210g may be formed on the second upper insulating layer 118. The bank layer 119 includes the first openings 119OP1. The first openings 119OP1 may overlap the first pixel electrodes 210g. The first pixel electrode 210g, the first emission layer 222g, and the counter electrode 230 which are sequentially stacked through the first opening 119OP1 may emit green light. The first opening 119OP1 is an area where green light is emitted, and the area may correspond to the green pixel Pg.

The first functional layer 221, the second functional layer 223, and the counter electrode 230 may be formed to entirely cover the bank layer 119, whereas the first emission layer 222g may be individually formed.

According to some embodiments, unlike the second emission layer 222r and the third emission layer 222b, the first emission layer 221g may be formed to overlap a plurality of first openings 119OP1, for example, two first openings 119OP1. When the first emission layer 222g is formed to correspond to two green pixels Pg, the area of the green pixel Pg, for example, the first opening 119OP1, may be sufficiently secured, thereby increasing an aperture ratio of a pixel.

Figure 9A:
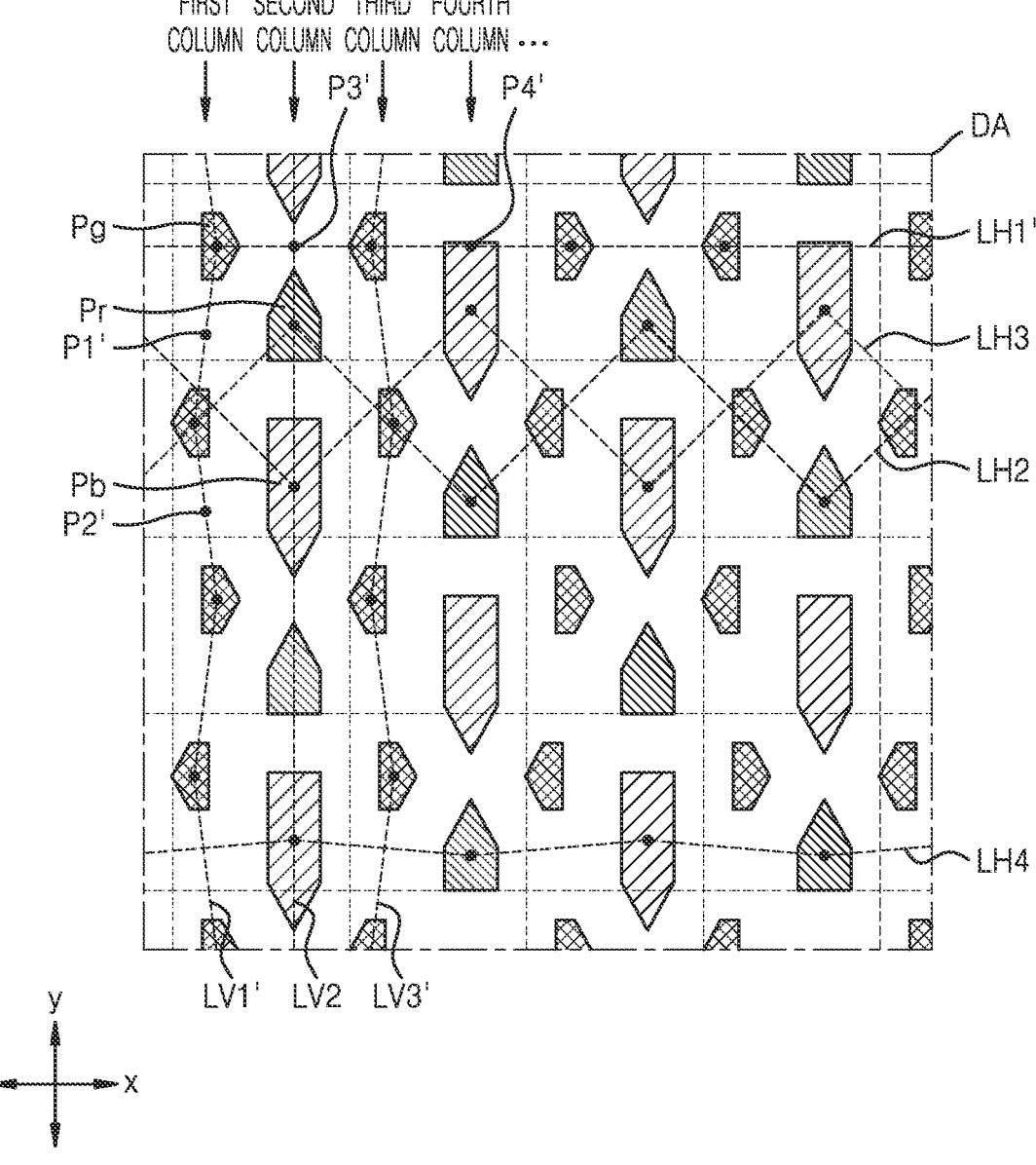
FIGS. 9A and 9B are plan views illustrating an arrangement of pixels of a portion of a display apparatus, according to some embodiments.
Figure 9B:
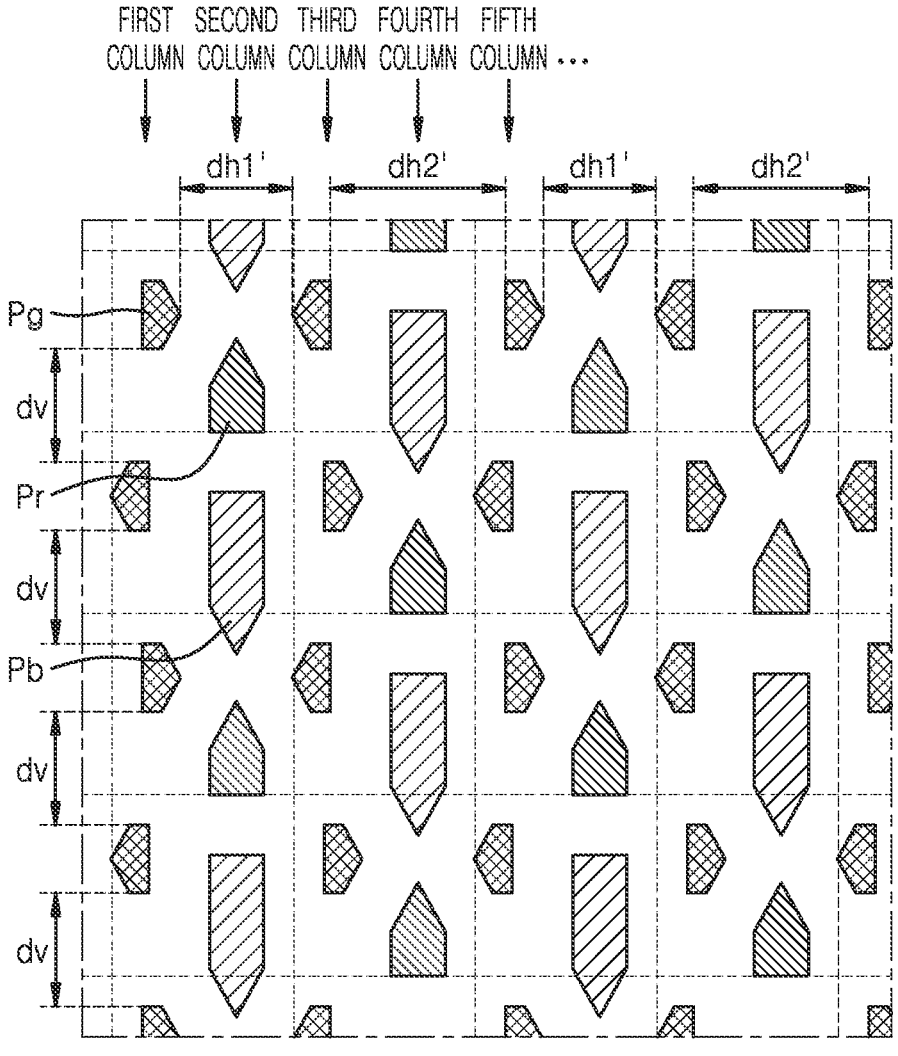
Figure 9B:
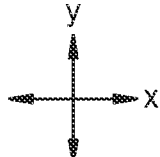

FIGS. 9A and 9B are plan views illustrating an arrangement of pixels of a portion of a display apparatus, according to some embodiments.

Referring to FIGS. 9A and 9B, an array of pixels may include a plurality of columns (or pixel columns) in the second direction (e.g., the y direction). From among first through third pixels of different colors, the second pixel and the third pixel may be arranged in the same column, and the first pixel may be located in a different column. For example, the red pixel Pr and the blue pixel Pb may be arranged in the same column, and the green pixel Pg may be located in a different column.

The array of pixels may include a first column of green pixels Pg, a second column of blue pixels Pb and red pixels Pr, a third column of green pixels Pg, and a fourth column of red pixels Pr and blue pixels Pb, and the first through fourth columns may be repeatedly arranged.

Referring to FIGS. 9A and 9B, an arrangement structure and a shape of the green pixels Pg are different from those in the above embodiments. The following will focus on the difference in the arrangement structure and the shape of the green pixels Pg, and a repeated description will be omitted.

In the first column, the green pixels Pg may be arranged to be spaced apart from each other. A virtual line connecting centroids of the green pixels Pg of the first column may have a zigzag shape. Centroids of the green pixels Pg of the first column may be located on a virtual zigzag line LV1' having a zigzag shape in the second direction (e.g., the y direction).

The green pixels Pg of the first column may at least partially overlap each other in the second direction. According to some embodiments, because centroids of the green pixels Pg of the first column are arranged in a zigzag shape in the second direction and the green pixels Pg of the first column overlap each other in the second direction, visibility may be improved when an image such as a straight line is displayed in the display area DA.

The first column may have a structure in which two green pixels Pg having different shapes are repeatedly arranged. The two green pixels Pg having different shapes may be referred to as a first green pixel Pg and a second green pixel Pg according to an arrangement order.

In the third column, like in the first column, centroids of the green pixels Pg may be located on a virtual zigzag line LV3' having a zigzag shape in the second direction (e.g., the y direction). The green pixels Pg of the third column may at least partially overlap each other in the second direction (e.g., the y direction).

The green pixels Pg of the third column may be shifted by a certain interval in the second direction (e.g., the y direction) compared to the green pixels Pg of the first column. For example, the green pixels Pg of the third column may be shifted by about one pixel interval compared to the green pixels Pg of the first column. The first green pixel Pg of the third column may correspond to the second green pixel Pg of the first column, and the second green pixel Pg of the third column may correspond to the first green pixel Pg of the first column.

The green pixel Pg of the first column and the green pixel Pg of the third column may be arranged in the same row. A centroid of the green pixel Pg of the first column and a centroid of the green pixel Pg of the third column which are arranged in the same row may be located on a virtual straight line LH1' extending in the first direction (e.g., the x direction).

Referring to FIG. 9B, in the first column, a shortest distance dv between adjacent green pixels Pg from among the green pixels Pg may be the same. In other words, the green pixels Pg of the first column may be arranged at the same interval.

A third shortest distance dh1' between two green pixels Pg adjacent to each other in the first direction (e.g., the x direction) from among the green pixels Pg may be different from a fourth shortest distance dh2' between two other green pixels Pg adjacent to each other in the first direction (e.g., the x direction) from among the green pixels Pg. For example, the third shortest distance dh1' between the green pixel Pg of the first column and the green pixel Pg of the third column which are arranged in the same row may be different from the fourth shortest distance dh2' between the green pixel Pg of the third column and the green pixel Pg of the fifth column which are arranged in the same row. In FIG. 4B, the third shortest distance dh1' between the green pixel Pg of the first column and the green pixel Pg of the third column which are arranged in the same row is less than the fourth shortest distance dh2' between the green pixel Pg of the third column and the green pixel Pg of the fifth column which are arranged in the same row. However, embodiments according to the present disclosure are not limited thereto. In some embodiments, the third shortest distance dh1' between the green pixel Pg of the first column and the green pixel Pg of the third column which are arranged in the same row may be greater than the fourth shortest distance dh2' between the green pixel Pg of the third column and the green pixel Pg of the fifth column which are arranged in the same row.

Referring to FIGS. 9A and 9B, each of the green pixel Pg, the red pixel Pr, and the blue pixel Pb may have a polygonal shape. At least one of the green pixel Pg, the red pixel Pr, or the blue pixel Pb may include at least five internal angles. For example, each of the green pixel Pg, the red pixel Pr, and the blue pixel Pb may have a pentagonal shape.

According to some embodiments, the green pixel Pg may have a shape in which both sides are symmetric to each other with respect to a virtual straight line LH1' that passes through a centroid of the green pixel Pg and a centroid of the green pixel Pg which are arranged in the same row. For example, the green pixel Pg may have a symmetrical pentagonal shape in which at least two internal angles are right angles. The green pixel Pg of FIG. 9A may have a shape obtained by removing the corner portion TR having an acute angle from the shape of the green pixel Pg of FIG. 5.

Two adjacent green pixels Pg from among the green pixels Pg may be symmetric to each other with respect to a reference point on a virtual straight line that connects centroids of the two green pixels Pg. For example, the second green pixel Pg of the first column may be located between two first green pixels Pg, and one of the two first green pixels Pg and the second green pixel Pg may be symmetric to each other with respect to a reference point P1' on a virtual straight line that connects centroids thereof. Also, the second green pixel Pg and the other green pixel Pg of the two first green pixels Pg may be symmetric to each other with respect to a reference point P2' on a virtual straight line that connects centroids thereof. The reference points P1' and P2' may be located on the virtual zigzag line LV1'.

Also, the green pixel Pg of the first column and the green pixel Pg of the third column which are adjacent to each other from among the green pixels Pg of the same row may be symmetric to each other with respect to a reference point P3' on a virtual straight line that connects centroids thereof. The green pixel Pg of the third column and the green pixel Pg of the fifth column which are adjacent to each other from among the green pixels Pg of the same row may be symmetric to each other with respect to a reference point P4' on a virtual straight line that connects centroids thereof. The reference points P3' and P4' may be located on the virtual straight line LH1'.

Figure 10A:
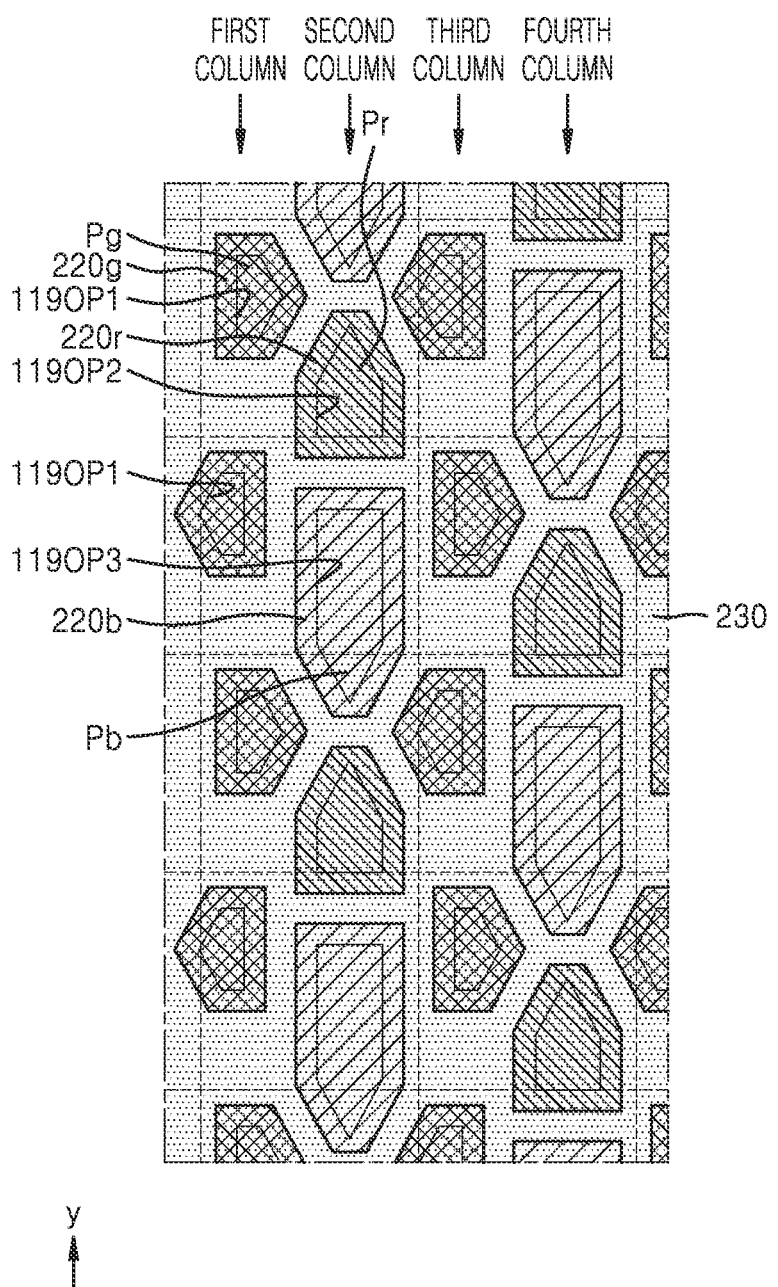
FIG. 10A is a plan view illustrating a part of a process of forming a display apparatus, according to some embodiments.
Figure 10B:
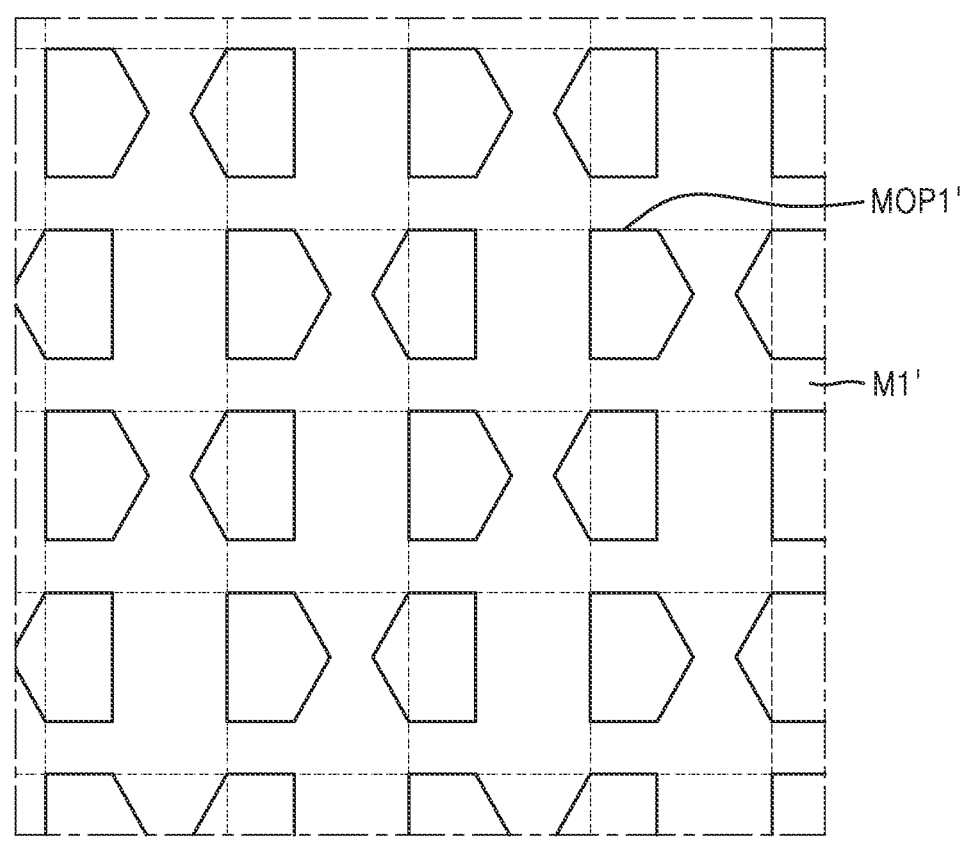
FIG. 10B is a plan view illustrating a mask sheet used to manufacture pixels of a display apparatus, according to some embodiments.
Figure 10B:
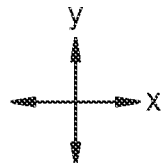

FIG. 10A is a plan view illustrating a part of a process of forming pixels of a display apparatus, according to some embodiments. FIG. 10B is a plan view illustrating a mask sheet used to manufacture pixels of a display apparatus, according to some embodiments.

Pixels of FIGS. 9A and 9B may be manufactured by using a manufacturing process of FIGS. 6A through 7C. However, referring to FIGS. 10A and 10B, there is a difference in a manufacturing process of the green pixels Pg from the embodiments shown with respect to FIGS. 6A through 7C.

The following will focus on the difference in the manufacturing process of the green pixels Pg, and a repeated description will be omitted.

Referring to FIG. 10A, the green pixel Pg may include the first pixel electrode 210g (see FIG. 6A), the first emission layer 222g, and the counter electrode 230. The first pixel electrode 210g (see FIG. 6A), the first emission layer 222g, and the counter electrode 230 which are sequentially stacked through the first opening 119OP1 may emit green light.

In the first column or the third column, a distance between the first openings 119OP1 may be the same. The first emission layers 222g may be spaced apart from each other, and may be respectively formed for the first openings 119OP1.

The first emission layers 222g may be formed by using, for example, a first mask sheet M1' (see FIG. 10B). The first mask M1' may include a plurality of first opening portions MOP1', and the first opening portions MOP1' may correspond to shapes and positions of the first emission layers 222g. The first opening portions MOP1' may correspond to the respective first openings 119OP1 of the bank layer 119.

According to some embodiments, a display apparatus having a relatively high aperture ratio and relatively excellent visibility may be provided. However, the scope of embodiments according to the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims, and their equivalents.

What is claimed is:

1. A display apparatus comprising:
a substrate; and
an array of pixels comprising first pixels, second pixels, and third pixels arranged on the substrate to respectively emit light of a first color, light of a second color, and light of a third color,
wherein the array of pixels comprises:
a first column comprising the first pixels; and
a second column located adjacent to the first column, and comprising the second pixels and the third pixels, wherein the second pixels and the third pixels are alternately arranged,
wherein a virtual line connecting centroids of the first pixels of the first column has a zigzag shape,
wherein a first shortest distance between two first pixels adjacent to each other in a first direction from among the first pixels is different from a second shortest distance between two other first pixels adjacent to each other in the first direction from among the first pixels.

2. The display apparatus of claim 1, wherein centroids of the second pixels and centroids of the third pixels of the second column are on a virtual straight line extending in a second direction that intersects the first direction.

3. The display apparatus of claim 2, wherein both sides of each of the second pixels and the third pixels of the second column are symmetric to each other with respect to the virtual straight line.

4. The display apparatus of claim 1, wherein any one third pixel of the third pixels of the second column is between two second pixels from among the second pixels of the second column, wherein an edge of the any one third pixel faces an edge of any one second pixel from among the two second pixels, and a corner portion of the any one third pixel faces a corner portion of another second pixel from among the two second pixels.

5. The display apparatus of claim 1, wherein two adjacent first pixels from among the first pixels are symmetric to each other with respect to a reference point on a virtual straight line that connects centroids of the two adjacent first pixels.

6. The display apparatus of claim 1, wherein the array of pixels further comprises a third column located adjacent to the second column, and comprising first pixels.

7. The display apparatus of claim 6, wherein centroids of the first pixels of the first column and centroids of the first pixels of the third column are on a virtual line having a zigzag shape in the first direction.

8. The display apparatus of claim 6, wherein centroids of the first pixels of the first column and centroids of the first pixels of the third column are on a virtual straight line extending in the first direction.

9. The display apparatus of claim 6, wherein the array of pixels further comprises a fourth column located adjacent to the third column, and comprising second pixels and third pixels, wherein the second pixels and the third pixels of the fourth column are alternately arranged, wherein the second pixels of the second column and the third pixels of the fourth column are arranged in a same row in the first direction, and centroids of the second pixels and centroids of the third pixels arranged in the same row are located on a virtual line having a zigzag shape in the first direction.

10. The display apparatus of claim 1, wherein at least one of the first pixels, the second pixels and the third pixels comprises at least five internal angles.

11. The display apparatus of claim 1, wherein a third shortest distance between two adjacent first pixels from among the first pixels of the first column is different from a fourth shortest distance between two other adjacent first pixels from among the first pixels of the first column.

12. The display apparatus of claim 1, wherein a shortest distance between adjacent first pixels from among the first pixels of the first column is same.

13. The display apparatus of claim 1, wherein the first pixels are green pixels, and either the second pixels or the third pixels are red pixels and the others of the second pixels and the third pixels are blue pixels.

14. A display apparatus comprising:

a substrate;

a plurality of pixel electrodes on the substrate;

a bank layer located on the plurality of pixel electrodes, and comprising a plurality of openings respectively overlapping the plurality of pixel electrodes;

first emission layers, second emission layers, and third emission layers on the bank layer; and a counter electrode on the first through third emission layers, wherein the plurality of openings of the bank layer comprise:

a first column comprising first openings; and a second column located adjacent to the first column, and comprising second openings and third openings, wherein the second openings and the third openings are alternately arranged, wherein a virtual line connecting centroids of the first openings of the first column has a zigzag shape, wherein a first shortest distance between two first openings adjacent to each other in a first direction from among the first openings is different from a second shortest distance between two other first openings adjacent to each other in the first direction from among the first openings.

15. The display apparatus of claim 14, wherein centroids of the second openings and centroids of the third openings of the second column are on a virtual straight line extending in a second direction that intersects the first direction.

16. The display apparatus of claim 14, wherein the plurality of openings further comprise a third column located adjacent to the second column, and comprising first openings.

17. The display apparatus of claim 16, wherein centroids of the first openings of the first column and centroids of the first openings of the third column are on a virtual line having a zigzag shape in the first direction.

18. The display apparatus of claim 16, wherein centroids of the first openings of the first column and centroids of the first openings of the third column are on a virtual straight line extending in the first direction.

19. The display apparatus of claim 14, wherein the second emission layers respectively overlap the second openings, the third emission layers respectively overlap the third openings, and the first emission layers are spaced apart from each other, wherein each of the first emission layers extends in the first direction and overlaps a plurality of first openings.

20. The display apparatus of claim 14, wherein the first emission layers are green emission layers that emit green light, the second emission layers are red emission layers that emit red light, and the third emission layers are blue emission layers that emit blue light.

* * * * *